(12) United States Patent
Seo

(10) Patent No.: US 10,989,564 B2
(45) Date of Patent: Apr. 27, 2021

(54) TRANSFER EQUIPMENT FOR A VACUUM CHAMBER

(71) Applicant: DMT Corporation, Pyeongtaek-si (KR)

(72) Inventor: Jong-Kyu Seo, Yongin-si (KR)

(73) Assignee: DMT Corporation, Pyeongtaek (KR)

( * ) Notice: Subject to any disclaimer, the term of this patent is extended or adjusted under 35 U.S.C. 154(b) by 91 days.

(21) Appl. No.: 16/423,034

(22) Filed: May 26, 2019

(65) Prior Publication Data

US 2019/0360841 A1  Nov. 28, 2019

(30) Foreign Application Priority Data

May 25, 2018  (KR) ........................ 10-2018-0059928

(51) Int. Cl.
 *G01D 5/20* (2006.01)
 *H05K 7/20* (2006.01)

(52) U.S. Cl.
 CPC ......... *G01D 5/2086* (2013.01); *H05K 7/2039* (2013.01)

(58) Field of Classification Search
 CPC ......... H01L 21/67748; H01L 21/68785; H01L 21/6719; H01L 21/67196; H01L 21/68707; H01L 21/67742; H01L 21/67709; H01L 21/67161; H05K 7/2039; H05K 13/0406; H05K 13/029; G05B 19/404; G01D 5/2086
 See application file for complete search history.

(56) References Cited

U.S. PATENT DOCUMENTS

| | | | |
|---|---|---|---|
| 2003/0129045 A1* | 7/2003 | Bonora | H01L 21/67766 414/217 |
| 2005/0087300 A1* | 4/2005 | Ishizawa | H01L 21/67742 156/345.31 |
| 2005/0118002 A1* | 6/2005 | Kasumi | H01L 21/67748 414/221 |

(Continued)

FOREIGN PATENT DOCUMENTS

| | | |
|---|---|---|
| JP | 2007-218630 A | 8/2007 |
| JP | 2011-002441 A | 1/2011 |

(Continued)

*Primary Examiner* — Glenn F Myers

(57) ABSTRACT

Provided is equipment for transferring a vacuum chamber that solves a problem of heat dissipation of a driver by (i) placing a permanent magnet, which is a stator structure of a linear motor and causes linear motion, inside a vacuum chamber and (ii) by placing a coil of a driver structure outside the vacuum chamber. Under this structure, (i) no cable is installed in inside the chamber, and (ii) heat generated from the driver structure can be smoothly dissipated. The transfer equipment includes: a first-axis linear coil (24) that is fixed to an outside of the vacuum chamber at a bottom surface of the housing (11) of the vacuum chamber (10); a first-axis slider (60) that is installed inside the vacuum chamber (10) and moves in a first-axis direction relative to a bottom of an inner space of the vacuum chamber (10); and a first-axis linear permanent magnet (63). The first-axis linear permanent magnet (63) is arranged in the first-axis direction, is installed in a lower portion of the first-axis slider (60), and slidingly moves together with the first-axis slider (60).

20 Claims, 22 Drawing Sheets

(56) References Cited

U.S. PATENT DOCUMENTS

| | | | |
|---|---|---|---|
| 2006/0027763 A1* | 2/2006 | Deak, IV | H01L 21/67126 |
| | | | 250/492.21 |
| 2010/0237819 A1* | 9/2010 | Binnard | G05B 19/404 |
| | | | 318/632 |
| 2010/0297562 A1* | 11/2010 | Shibazaki | H01L 21/6838 |
| | | | 430/325 |
| 2011/0076119 A1* | 3/2011 | Tobe | B65G 49/061 |
| | | | 414/217 |

FOREIGN PATENT DOCUMENTS

| | | |
|---|---|---|
| KR | 20-2012-0004302 A | 6/2012 |
| KR | 10-2017-0048707 A | 5/2017 |

* cited by examiner

TRANSFER EQUIPMENT FOR A VACUUM CHAMBER

CROSS-REFERENCE TO RELATED APPLICATION

This application claims the benefit of and priority to Korean Patent Application No. 10-2018-0059928 filed on May 25, 2018, which are herein incorporated by reference in its entirety.

FIELD OF INVENTION

The present invention relates to a transfer equipment structure that employs a linear motor does not place a cable and a heat source inside a vacuum chamber of a high voltage environment.

BACKGROUND ART

A device loading a sample after requires in a vacuum chamber for test requires transfer equipment since it needs to move the sample from an inserting location to a testing location because the location where the sample is inserted and the location where the sample is tested are different.

For such transfer equipment, screw transfer equipment that uses a rotary motor is widely used. However, due to backlash of the screw transfer equipment, precise control of the sample is difficult. Accordingly, transfer equipment in a vacuum environment that employs a linear motor and a linear encoder is widely developed as an alternative. However, in order for the linear motor and the linear encoder to be installed inside the vacuum chamber, cables for supplying power and signals to the linear motor and the linear encoder must be installed inside the vacuum chamber.

In order to place the cables inside the vacuum, chamber, expensive parts (feed through) are required for connecting an atmospheric pressure environment outside the vacuum chamber to a vacuum environment inside the vacuum chamber.

However, test environments inside the vacuum chamber vary. In a certain occasion, the inside of the vacuum chamber may be required to be under high voltage, and in another occasion, it is in a vacuum state. Therefore, if the cables are installed in such a high voltage and vacuum environment, there is a high possibility that disturbance or error of a cable signal may occur.

Moreover, when the linear motor is installed inside the vacuum chamber, there is a high possibility of heat dissipation problem due to a heat generated from a coil of the linear motor. Because there is little heat transfer in the vacuum environment inside the vacuum chamber, an additional heat dissipation structure for dissipating the heat generated from the coil of the linear motor may be required.

Technical Problem to be Solved

The present invention has been made in order to solve the above problems.

A first objective is providing vacuum chamber transfer equipment that employs linear motion without placing cables inside a vacuum chamber in a high voltage environment.

A second objective is providing vacuum chamber transfer equipment that does not have a heat dissipation problem due to a heat generated from a coil of a linear motor.

SUMMARY OF INVENTION

To solve the above problems, the present invention provides a vacuum chamber transfer equipment that has a permanent magnet, which is a stator of a linear motor, installed inside a vacuum chamber, has a coil, which is a rotor structure, installed in an atmospheric pressure environment outside the vacuum chamber so that cables are not placed inside the vacuum chamber, and solves a heat dissipation problem of a driver.

In addition, according to vacuum chamber transfer equipment of the present invention, a head, which is a reader portion of a linear encoder, is installed outside the vacuum, chamber. A scale, which is a scale portion of the linear encoder, is installed inside the vacuum chamber. Such structure allows cables connected to the head of the linear encoder to be placed outside the vacuum chamber.

The present invention relates to transfer equipment for transferring a bed (90) provided in a vacuum chamber (10) in a first-axis direction and in a second-axis direction that intersects with the first-axis direction.

The transfer equipment comprises: a first-axis linear coil (24) fixed outside of the vacuum chamber at a bottom of a housing (11) of the vacuum chamber (10); a first-axis slider (60), installed inside the vacuum chamber (10), that is slidingly movable in the first-axis direction relatively to the bottom of an inside of the vacuum chamber (10); and a first-axis linear permanent magnet (63) arranged in the first-axis direction and installed at a lower portion of the first-axis slider (60) to slidingly move together with the first-axis slider (60).

The transfer equipment further includes a first thin layer (213). The first thin layer (213) is placed between the first-axis linear coil (24) and the first-axis permanent magnet (63), has a thickness thinner than a thickness of a portion forming a bottom surface of the housing (11), includes a material through which the magnetic field penetrates, and has a upper portion facing inside the vacuum chamber and a lower portion facing outside the vacuum chamber.

In the above transfer equipment, a cable can be connected to the first-axis linear coil (24) from an outside of the vacuum chamber (10). The first-axis linear coil (24) is housed in a coil housing (21) and is installed on a bottom surface of the vacuum chamber (10).

The coil housing (21) includes: a side-wall portion (211) surrounding sides of the first-axis linear coil; a flange portion (212) extending laterally outward from the sidewall portion (211) and the thin layer (213) provided on an inner periphery of the sidewall portion (211) and surrounding the first-axis linear coil (24) together with the sidewall portion (211). A sealing member (S) is inserted between the flange portion (212) and the housing (11) of the vacuum chamber (10).

The coil housing (21) is provided with a coil cover (28) which cove a lower portion of the first-axis linear coil (24) under the side-wall portion (211). The first-axis slider (60) is provided with a first linear scale (641) extending in the first-axis direction. An encoder (34), facing the first linear scale (641), is installed outside the vacuum chamber and is provided at the bottom of the housing (11) of the vacuum chamber (10).

A second cable is connected to the encoder (34) from outside the vacuum chamber (10), so that the second cable is not placed inside the vacuum chamber. A coil receiving groove (611) is provided inside the first-axis slider (60) and is isolated from an inner space of the vacuum chamber. A second-axis linear coil (71) is provided in the coil receiving groove (611).

A second-axis slider (80) is provided in the vacuum chamber (10), installed at the first-axis slider (60), and slidingly moves in the second-axis direction relatively to the first-axis slider (60). A second-axis linear permanent magnet (81) is installed between the second-axis slider (80) and the second-axis linear coil (71), is arranged in the second-axis direction, and slidingly moves together with the second-axis slider (80).

A portion of the first-axis slider (60) disposed between the second-axis linear coil (71) and the second-axis linear permanent magnet (81) is provided with a second thin layer (612). The second thin layer (612) has a thickness thinner than a thickness of a member surrounding the second thin layer (612), includes a material through which magnetic field penetrates, and has a first side and a second side. The first side, which faces the second-axis linear permanent magnet (81), faces inside the vacuum chamber. The second side, which faces the second-axis linear coil (71), is isolated from a vacuum environment of the vacuum chamber.

The housing (11) of the vacuum chamber (10) is provided with one or more bellows connecting portions (19). In an embodiment, two bellows connecting portions are provided. Each of the bellows connecting portion (19) includes a cable through hole (191). One or more bellows may be provided inside of the vacuum chamber (10). In an embodiment, two bellows (66, 67) are provided. First ends of the two bellows (66, 67) are connected to the two bellows connecting portions (19), respectively. Second ends of the two bellows (66, 67) are connected to the first-axis slider (60) A passage is provided by the bellows. The passage connects the coil receiving groove (611) to outside the vacuum chamber (10).

A third cable (711), through the cable through hole (191) and the bellows (66, 67), is connected to the second-axis linear coil (71) contained in the coil receiving groove (611). The second-axis slider (80) is provided with a second linear scale (85) extending in the second-axis direction. The first-axis slider (60) is provided with an encoder receiving groove (613), which is isolated from an inner space of the vacuum chamber. The encoder receiving groove (613) is provided with a second-axis encoder (75) facing the second, linear scale (85).

A fourth cable (751), through the cable through hole (191) and the bellows (66, 67), is connected to the second-axis encoder (75) contained in the encoder receiving groove (613). The first-axis slider (60) is provided with a bellows holder (65) connected to the second ends of the bellows (66, 67). The bellows (66, 67) extend parallel to the first-axis direction and in opposite directions to each other with respect to the bellows holder (65).

Advantages

According to the present invention, a cable and a connecting part are not placed inside a vacuum chamber by designing such that a driver of a linear motor, to which a cable is connected and a head of a linear encoder, is installed outside the vacuum chamber. Accordingly, it is possible to realize vacuum chamber transfer equipment at low cost.

The present invention reliably operates even under a high voltage chamber, in which test environment signal disturbances can occur, since the cable is not placed inside the chamber. According to the present invention, a heat source is installed outside the vacuum chamber, conduction, convection, and radiation can all be used as a heat dissipation path. Therefore, it is very easy to handle heat dissipation.

In addition to the above-mentioned advantages, the present invention will be described in more detail below.

DETAILED DESCRIPTION OF THE INVENTION

Figure 1:
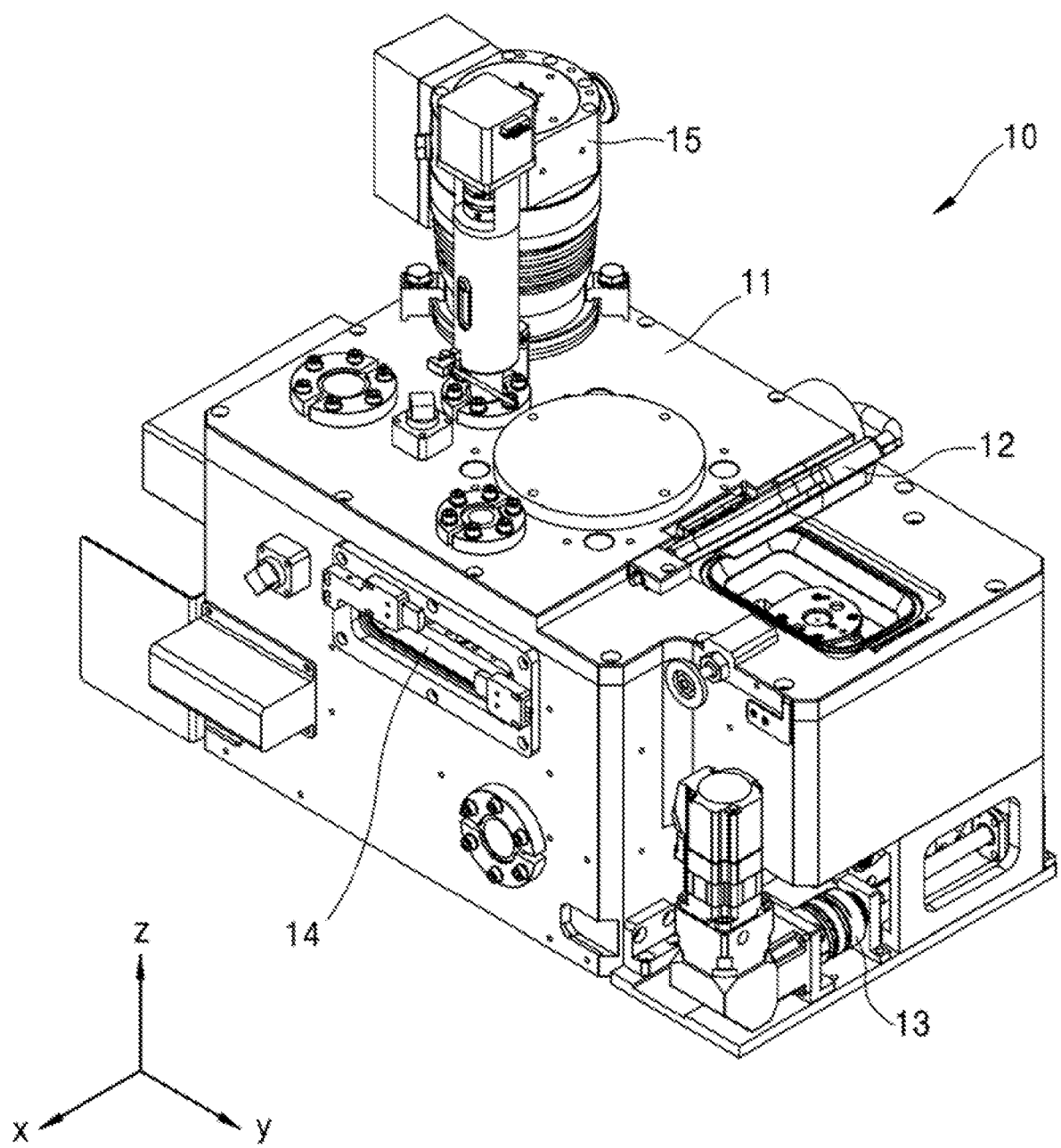
FIG. 1 is a top perspective view of a chamber of transfer equipment according to the present invention.
Figure 2:
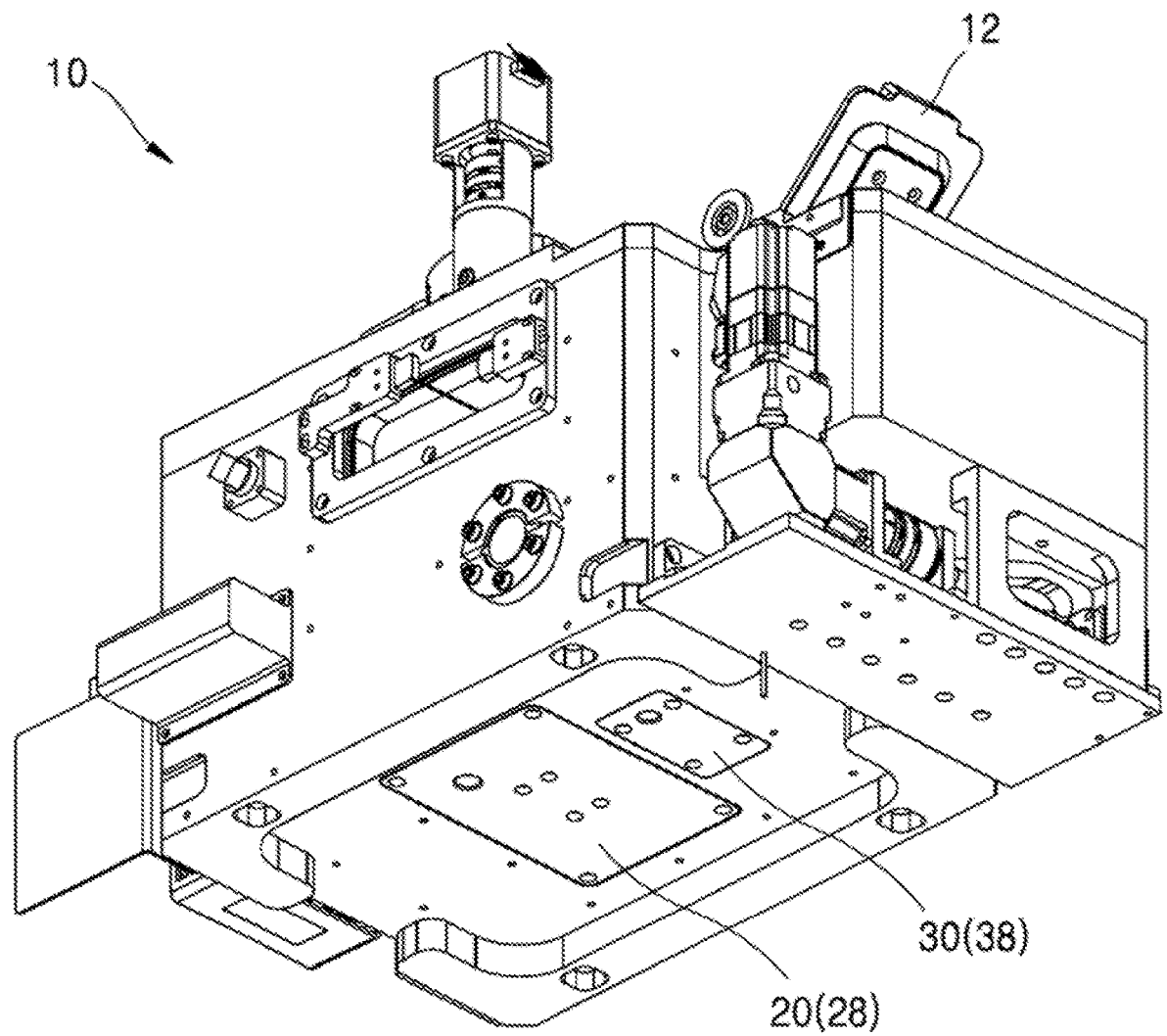
FIG. 2 is a bottom perspective view of the chamber of FIG. 1.
Figure 3:
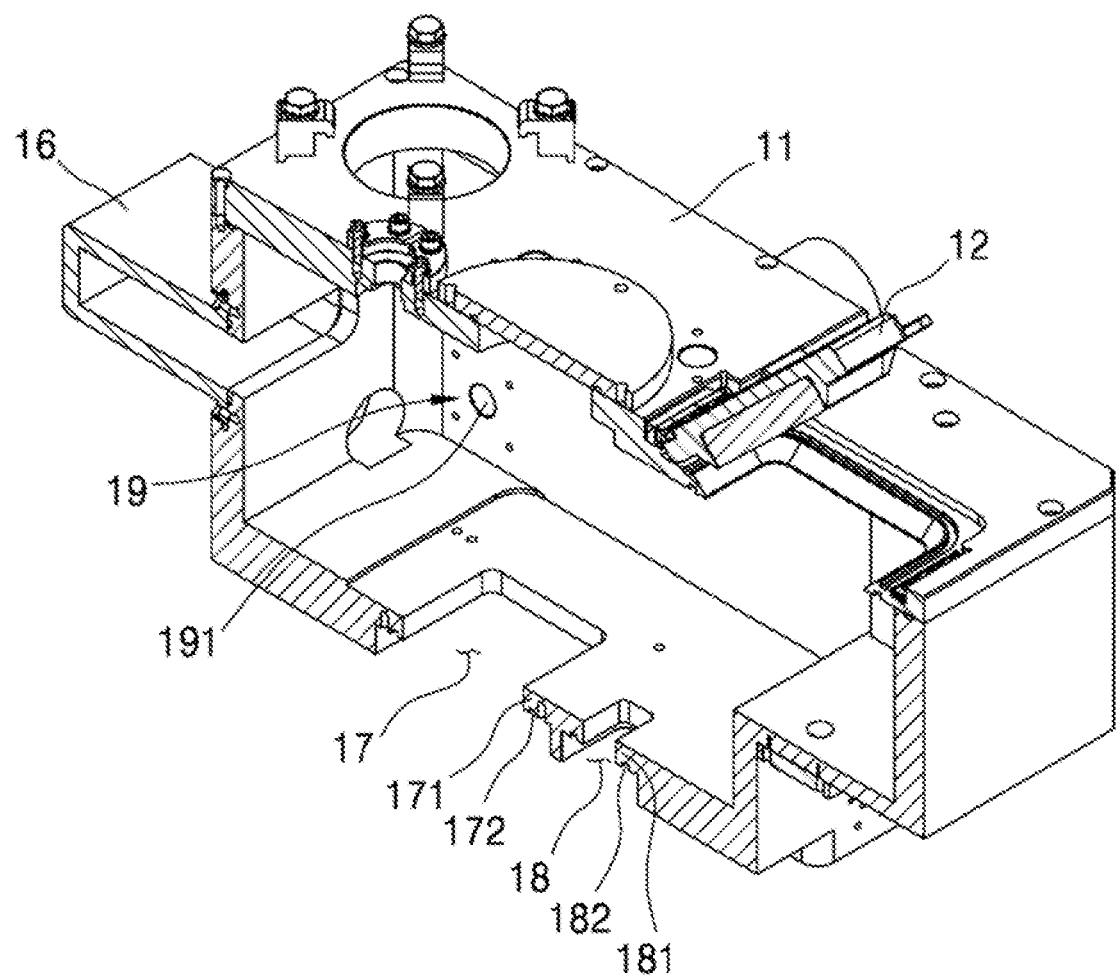
FIG. 3 is a side sectional perspective view showing a housing of the chamber in FIG. 1.
Figure 4:
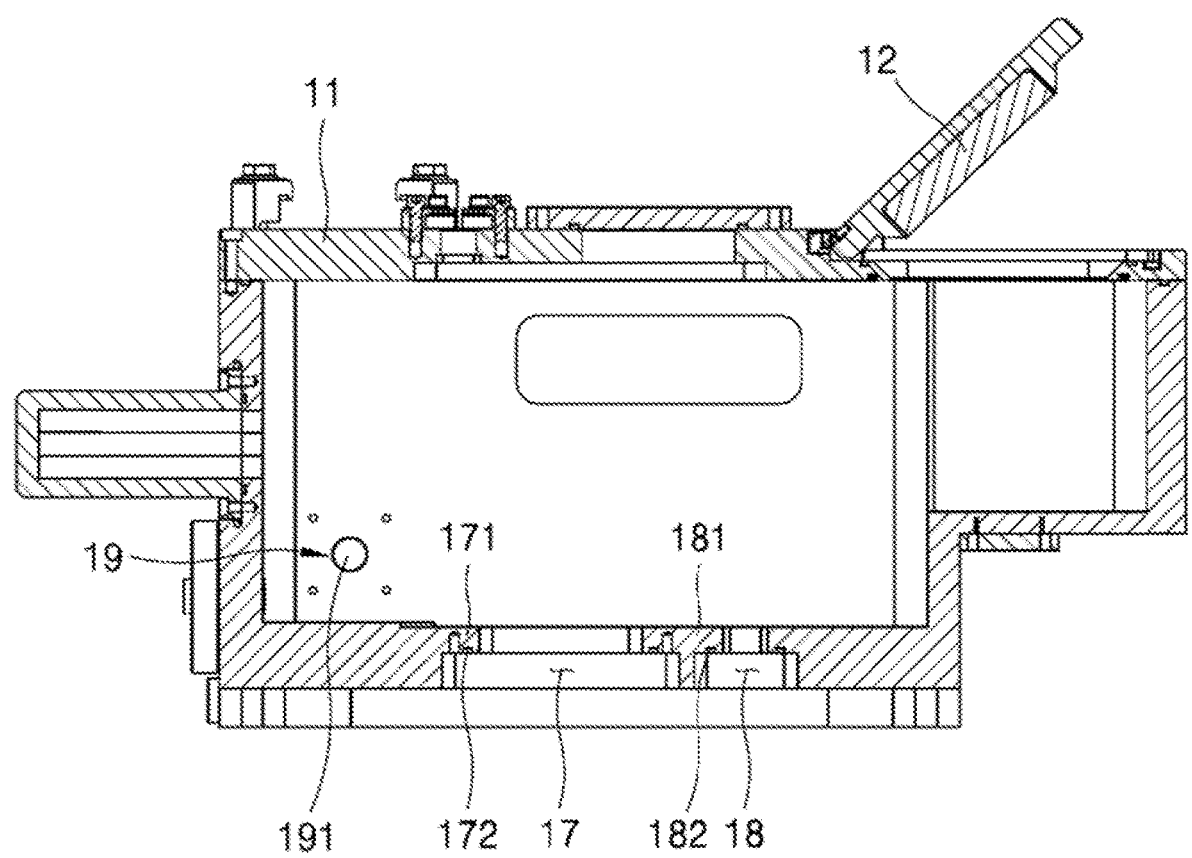
FIG. 4 is a side view of FIG. 3.

Hereinafter, preferred embodiments of the present invention will be described in detail with reference to the accompanied drawings. It is to be understood that the present invention is not limited to the disclosed embodiments, and should not be construed as limited to the embodiments set forth herein. Rather, modification can be made in many different forms.

[Structure of Chamber]

Hereinafter, a vacuum chamber of the transfer equipment of the present invention will be described with reference to FIGS. 1 to 7. The vacuum chamber (10) includes a housing (11) defining an interior space.

An inner space of the housing (11) is isolated from an outer space of the housing (11), and the inner space thereof is maintained in a vacuum state by using a vacuum pump (15) or alike. On a first side surface of the housing (11) a transparent window (14) for viewing an inside of the housing is provided, and an inside of the vacuum chamber can be seen from an outside of the vacuum chamber.

The housing (11) is provided with a passage through which a sample can be inserted into and withdrawn from the vacuum chamber (10). Such a passage is openable and closable by a door (12).

The door (12) is hermetically connected to the housing (11) because it forms a boundary between a vacuum environment inside the vacuum chamber and an atmospheric pressure environment outside the vacuum chamber. According to the present invention, the door (12) is provided on a first side of an upper portion of the vacuum chamber (10), and the passage is opened upward by the door.

A sample lifting means (13) is provided at a lower end portion of the vacuum chamber (10) where the door (12) is installed. The sample lifting means (13) is provided outside the vacuum chamber, and a space between the door (12) and the sample lifting means (13) is an internal space of the vacuum chamber. The sample lifting means (13) lifts a sample provided on the sample lifting means (13) inside the vacuum chamber and exposes the sample toward the door (12). Accordingly, it is easy for a user to insert and remove the sample exposed toward the door.

A coil mounting portion (17) and an encoder mounting portion (18), on which a first-axis (x-axis) coil assembly (20) and a first-axis (x-axis) encoder assembly (30) are respectively installed, are formed on a bottom surface of the housing (11). The coil mounting portion (17) is a rectangular through-hole and has a first step part (171) extending inward toward the through hole.

The first step part (171) is provided with a first scaling groove (172), on which an O-ring or a similar object is pressed for sealing a vacuum atmosphere, and a first nut groove for fixing the first-axis coil assembly. Of course, the first nut groove does not penetrate a bottom part of the housing, preventing leakage of vacuum.

The encoder mounting portion (18) is formed on a side of the coil mounting portion (17), is in a rectangular through-hole shape, and has a second step part (181) extending inward toward the through hole.

The second step part (181) is provided with a second sealing groove (182), on which an O ring or a similar object is pressed for sealing a vacuum atmosphere, and a second nut groove (not shown) for fixing the first-axis encoder assembly (30). Of course, the second nut groove does not penetrate the bottom part of the housing, preventing leakage of vacuum. On a side surface of the housing (11) that intersects with the first-axis (x-axis), a bellows connecting portion (19) is provided, in which bellows 66 and 67 described later are installed.

The bellows connecting portion (19) is provided with a cable through hole (191). Each of the bellows connecting portions (19) is provided on each side of the housing (11) in the x-axis direction, and each of the bellows connecting portions (19) is connected to a pair of bellows (66, 67), respectively.

An extension chamber portion (16) is provided on a side of the housing (11) that intersects with the second-axis (y-axis) and provides an extended space in which a second-axis (y-axis) slider (80), described below, can be received.

An inside of the extension chamber portion (16) becomes an expanded space of a vacuum atmosphere of the vacuum chamber (10) and provides an additional space that allows the second-axis slider (80) to move in a second-axis direction. Transfer equipment for transferring a sample (91) is installed in a lower portion of the vacuum chamber (10) and includes the coil installation part (17) and the encoder installation part (18).

[Transfer Equipment]

The transfer equipment of the vacuum chamber according to the present invention comprises a first-axis transfer structure and a second-axis transfer structure. A first-axis transfer drive structure is provided to the first-axis coil assembly (20) installed in the coil mounting portion (17) and to the first-axis slider (60). The first-axis slider (60) is installed inside the vacuum chamber provided at an upper portion of the coil mounting portion (17) and can slidingly move in the first-axis direction. A first-axis transfer distance control structure is provided in the first-axis slider (60) and in the first-axis encoder assembly (30) installed in the encoder mounting portion (18).

A second-axis transfer drive structure and a second-axis transfer distance control structure are provided in the first-axis slider (60) and in a second-axis slider (80). The second-axis slider (80) is installed in an upper portion of the first-axis slider (60) and slidingly moves in a second-axis direction.

A bed (90), on which the sample (91) is placed, is provided on the second-axis slider (80). Thus, through a first-axis transfer and a second-axis transfer, the sample is transferred to a desired location in the vacuum chamber.

[First Axis Transfer Structure]

The first axis transfer drive structure is implemented by a linear motor. According to the present invention, a linear coil of the linear motor is fixed outside the vacuum chamber (10). A linear permanent magnet of the linear motor is installed in the first-axis slider (60) inside the vacuum chamber.

The linear motor includes a linear permanent magnet and a linear coil. The linear permanent magnets must be installed in every place where linear motion takes place in, while the linear coils are installed only in a portion of a section of the linear permanent magnet.

A cable for supplying power is connected to a coil of a motor. When the coil of the motor is installed on a rotor in a rotary motor, a brush must be used because a cable cannot be directly connected to the coil of the motor. On the other hand, in a linear motor, a cable can be directly connected even when the linear coil is installed on the mover. For such a reason, when a linear motor is implemented, a linear permanent magnet is provided on a stator side, and a linear coil is provided on a mover side.

However, when the coil of the motor is provided on a mover (first-axis slider) in a vacuum atmosphere inside the vacuum chamber, it is difficult to release heat generated from the coil to an outside of the vacuum chamber. Cables that can withstand an internal environment of the vacuum chamber should be used, and expensive parts (feed through) should be used in a boundary where the cable enters from outside the vacuum chamber to inside the vacuum chamber.

If a high-voltage environment is required inside the vacuum chamber to test a sample, a signal from the cable inside the vacuum chamber may be disturbed. Thus, the present invention provides a structure in which a linear coil is provided outside a vacuum chamber as a stator, and a linear permanent magnet is provided inside the vacuum chamber as a mover. Under this structure, a cable connected to a linear coil is located outside the vacuum chamber, rather than being present inside the vacuum chamber.

Referring to FIGS. 8 to 12, the first-axis linear coil (24), installed on a coil housing (21), is installed on the coil mounting portion (17) provided on a bottom side of the housing (11) of the vacuum chamber. The coil housing (21) is installed in the coil mounting portion (17) and becomes a part of the housing (11).

The coil housing (21) includes a sidewall portion (211) in a rectangular hollow pillar shape and a first thin layer (213) that covers an upper end portion of the sidewall portion (211). A hollow inner space defined by the sidewall portion (211) and the first thin layer (213) become a receiving space in which the first-axis linear coil (24) is provided.

The first-axis linear coil (24), while being provided in the receiving space, may be fixed to the side wall portion (211) and the first thin layer (213) with an adhesive or something similar. At a lower end of the sidewall portion (211), a flange portion (212) that extends laterally outward is further provided. An upper surface of the flange portion (212) faces and can contact closely with a bottom surface of the first step part (171) of the coil mounting portion (17).

The flange portion (212) is provided with a through hole, through which a bolt passes. The through hole faces the first nut groove of the first step part (171) described above. Therefore, when the bolt is tightened, the flange portion (212) and the first step part (171) are tightly adhered to each other.

An O-ring serving as a sealing part is pressed between an tipper surface of the flange portion (212) and a bottom surface of the first step part (171) to prevent the vacuum chamber from leaking. A flat coil cover (28) may be provided on a lower surface of the flange portion (212).

The coil cover (28) protects the first-axis linear coil (24) provided in the coil housing (21). Of course, a cable (not shown) connected to the first-axis linear coil (24) can pass through the coil cover (28) and can be placed outside the vacuum chamber. A base plate (69) is fixed to an upper portion of a bottom surface of the housing (11), and the first-axis slider (60) is installed on an upper portion of the base plate (69) in a slidingly movable manner.

A first-axis linear bearing (68) extending in the first-axis direction is provided at a position where the base plate (69) and the first-axis slider (60) face each other. A first-axis linear permanent magnet (63) extending in the first-axis direction is provided on a lower surface of the first-axis slider (60).

An upper end of the coil housing (21) protrudes above the base plate through the base plate (69) and faces the first-axis linear permanent magnet (63). While it is better for the first-axis linear permanent magnet (63) and the first-axis linear coil (24) to be as close to each other as possible, the first-axis linear permanent magnet (63) is present inside the vacuum chamber, and the first-axis linear coil (24) is present outside the vacuum chamber.

In the present invention, the first thin layer (213), which is present between the first-axis linear permanent magnet (63) and the first-axis linear coil (24) and divides an inside and an outside of the vacuum chamber, is provided at an upper end of the coil housing (21).

The first thin layer (213) can be made with a thickness as thin as possible so that the first-axis linear permanent magnet (63) and the first-axis linear coil (24) can be placed adjacent to each other. At the same time, the first thin layer (213) has a thickness sufficient to withstand a difference in pressure between an inside and an outside of the vacuum chamber. Accordingly, the first thin layer (213) is made thinner than other parts around the first thin layer (213).

The first thin layer (213) is made of a material (material other than a ferromagnetic material) capable of penetrating a magnetic field without affecting a magnetic field formed by the first-axis linear permanent magnet and the first-axis linear coil. For example, the first thin layer (213) is made of aluminum or an alloy thereof, allowing excellent heat dissipation effect without affecting a magnetic field formed by the first-axis linear coil (24).

In the structure shown in the embodiment, the coil housing (21) is coupled to the housing from an outside of the vacuum chamber. However, the present invention is not limited to the structure.

That is, in another embodiment, the coil housing (21) is coupled to the housing inside the vacuum chamber. This is the same for the first-axis encoder assembly.

The encoder mounting portion (18) is provided with the first-axis encoder assembly (30). The first-axis encoder assembly (30) includes an encoder housing (31) in which an encoder (34) is placed. An upper end of the encoder housing (31) is placed facing an inside of the vacuum chamber, and the encoder (34) faces an inside of the vacuum chamber. A flange extending laterally outward is provided at a lower end of the encoder housing (31). The flange is closely attached to a lower surface of the first step part (181) of the encoder mounting portion (18) with a sealing member. A flat plate-like encoder cover (38) is provided under the flange, thus protecting the encoder (34). A cable (not shown) connected to the encoder (34) passes through the encoder cover (38) and is connected to an outside of the chamber. A structure in which the encoder housing (31) is installed in the housing and a structure in which the encoder cover is attached to the encoder housing are similar to the case of the first-axis coil assembly, and therefore a repetitive description will be omitted.

On a side surface of the first-axis slider (60), a structure for installing a linear scale (641) in the direction, in which the encoder (34) is facing, is further provided. The structure includes a "¬" or "r"-shaped reader part (64) that extends laterally from a side of the first-axis slider (60). On a bottom surface of the encoder reader part (64), the linear scale (641) is installed in the first-axis direction, facing the encoder (34).

According to the above-described structure, since the first-axis linear coil (24) and the encoder (34) for the first-axis transfer drive and the first-axis transfer control are installed in the housing outside the vacuum chamber, cables connected to them do not have to be installed inside the vacuum chamber.

[Second-Axis Transfer Structure]

The second-axis transfer drive structure is also implemented by a linear motor. According to the present invention, the linear coil of the linear motor is installed inside the vacuum chamber (10) provided inside the first-axis slider (60), and the linear permanent magnet of the linear motor is fixed to the second-axis slider (80) inside the vacuum chamber.

Referring to FIGS. 8, 9, and 13 to 26, the first-axis slider (60) is provided inside the vacuum chamber and has a cuboid shape. In addition, a first slider (61) and a second slider (62) each in a cuboid shape are stacked.

The second slider (62) is located below the first slider (61), and the first-axis linear permanent magnet (63) is installed on a lower surface of the second slider (62). The encoder reader part (64) is also installed on the second slider (62). Since the linear permanent magnet (63) and the encoder reader part (64) are provided on a same part (the second slider), displacement of the first-axis slider can be accurately controlled.

The first slider (61) or the second slider (62) is provided with a space, in which a second-axis (y-axis) linear coil (71) and a second-axis (y-axis) encoder (75) can be installed. The first slider 61 and the second slider 62 can be separated from each other and can access the space.

It is preferable that the second-axis linear coil (71) and the second-axis encoder (75) are installed together in a same part. In an embodiment of the present invention, they are provided on the first slider (61).

Since the second-axis (y-axis) slider (80) is provided on an upper portion of the first slider (61), in order to more securely control a position of the second-axis slider (80) with respect to the first-axis slider (60), it is preferable that the second-axis linear coil (71) and the second-axis encoder (75), which linearly drive the second-axis slider (80) and measure a displacement thereof, are provided on a same part, i.e., on the first slider (61).

It is apparent that the same effect can be obtained when the first-axis linear coil (24) and the encoder (34) are installed together to a same part, i.e., to a bottom portion of the housing. Of course, the present invention does not exclude installing the second-axis linear coil and the second-axis encoder on the second slider (62).

The first slider (61) is provided with a coil receiving groove (611) and an encoder receiving groove (613) which are concave upward from a bottom. The second-axis (y-axis) linear coil is fixed in the coil receiving groove (611), and the second-axis (y-axis) encoder (75) is provided in the encoder receiving groove (613).

An upper end of the coil receiving groove (611) is closed by the second thin layer (612) that is much thinner than the first slider (61). A method of setting a thickness of the second thin layer (612) is similar to that of the first thin layer (213) described above, so redundant description is omitted.

Moreover, an encoder hole (614) is provided in an upper end of the encoder receiving groove (613), and an upper end of the second-axis encoder (75) is fitted to this and is sealed. Under this structure, the upper end of the encoder (75) faces above.

On a bottom surface of the first slider (61), a sealing groove (615) is provided around the coil receiving groove (611) and the encoder receiving groove (613). An O-ring (not shown) serving as a sealing member is fitted in the sealing groove (615). The sealing member is interposed and pressed between a bottom surface of the first slider (61) and a top surface of the second slider (62).

Figure 16:
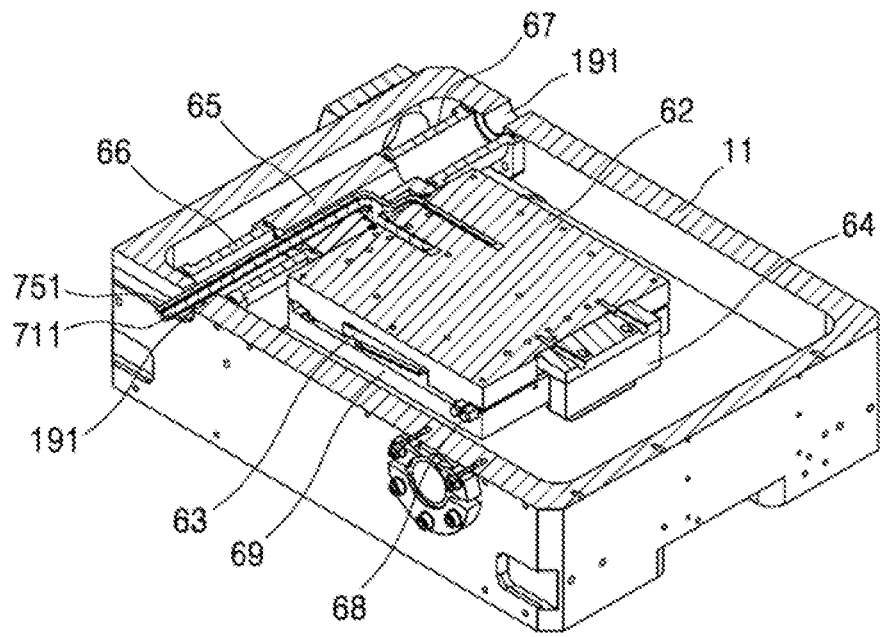
FIG. 16 is a perspective view showing the sectional line 1-1 in FIG. 5.
Figure 17:
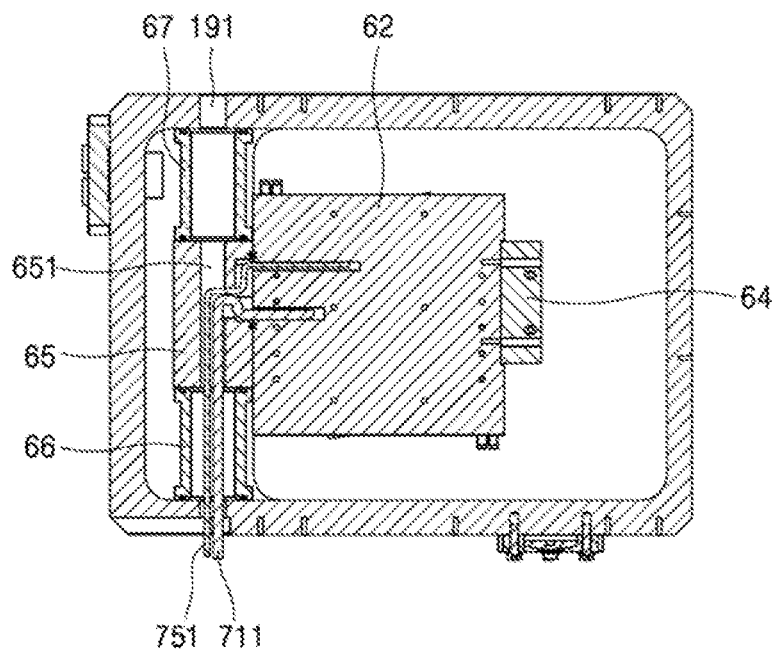
FIG. 17 is a plan view thereof.
Figure 18:
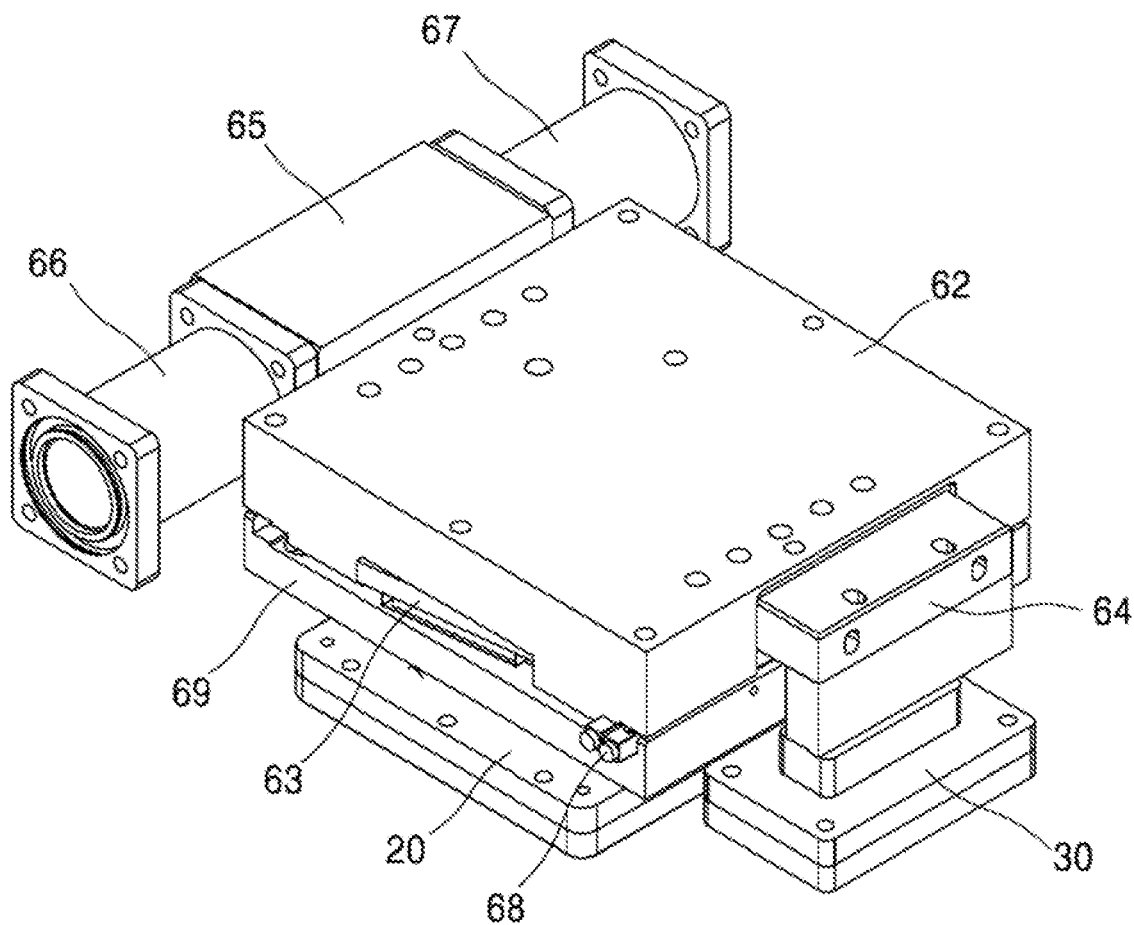
FIG. 18 is a perspective view showing a part of a transfer equipment of the chamber according to the present invention.
Figure 19:
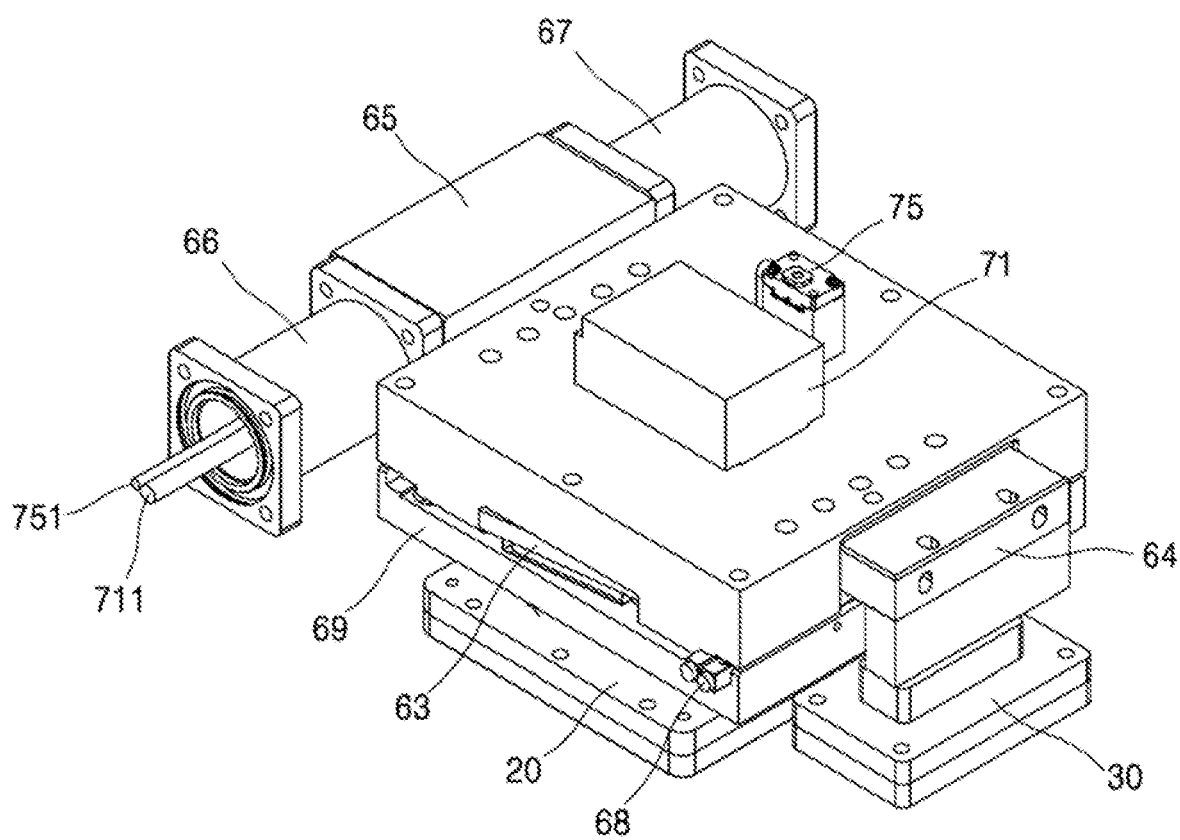
FIG. 19 is a perspective view of FIG. 18 to which a second-axis linear coil and a second-axis encoder are added.
Figure 20:
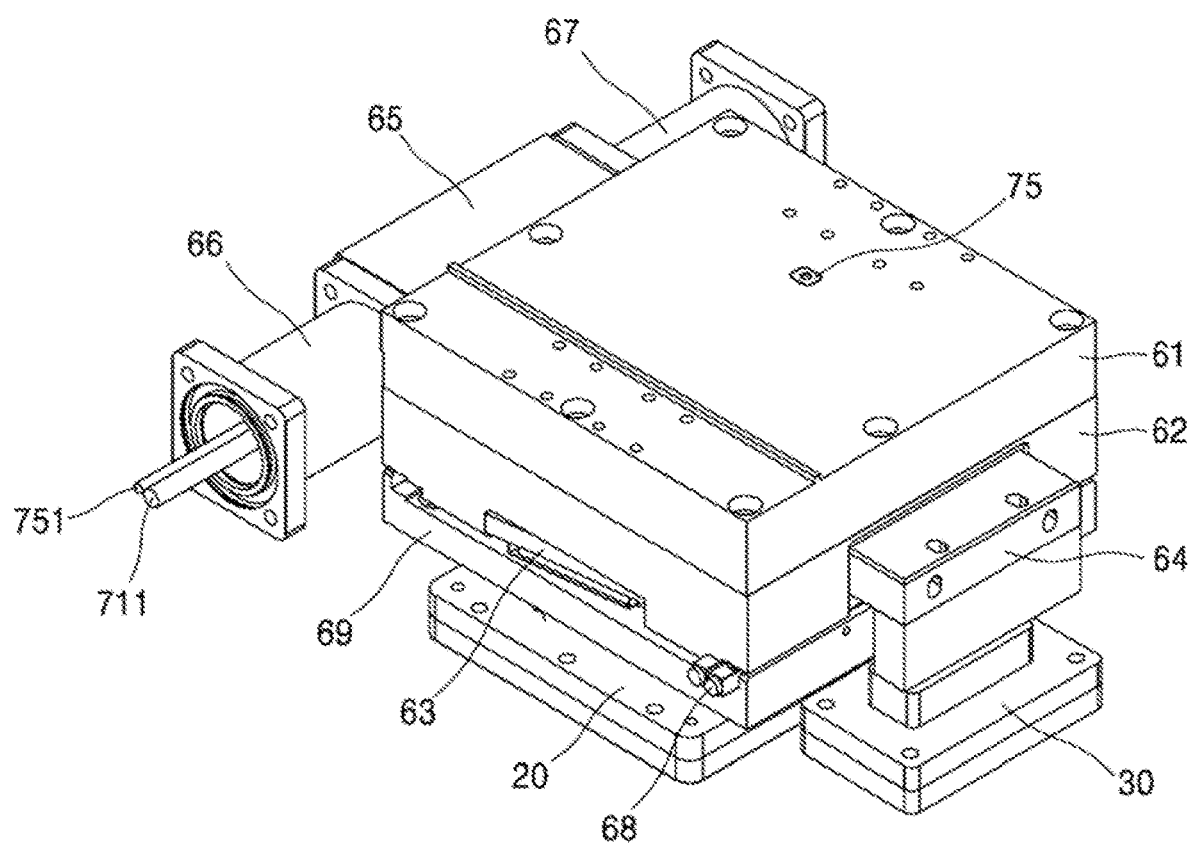
FIG. 20 is a perspective view of FIG. 10 to which a second-axis slider of the first-axis slider is further provided.
Figure 21:
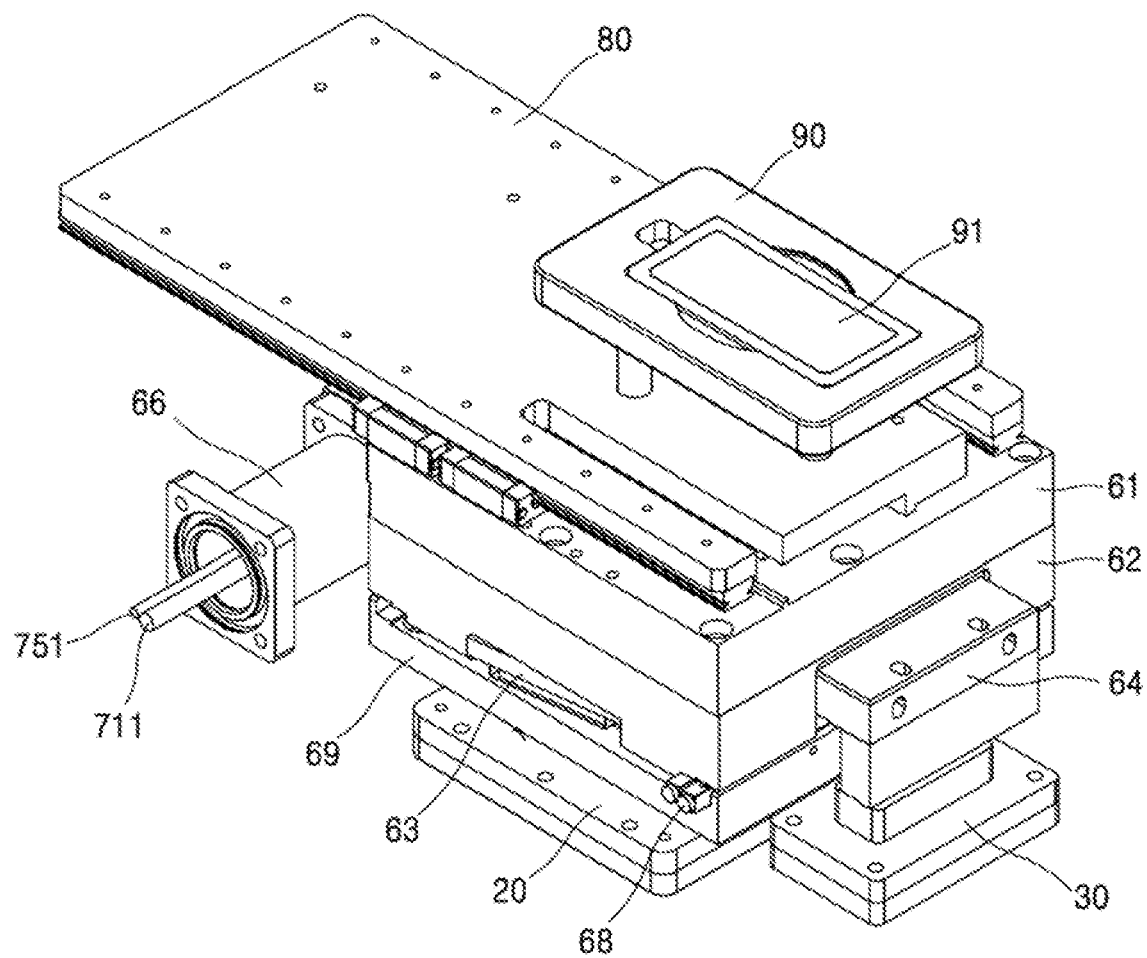
FIG. 21 is a perspective view of FIG. 20 to which the second axis-slider is further provided.
Figure 22:
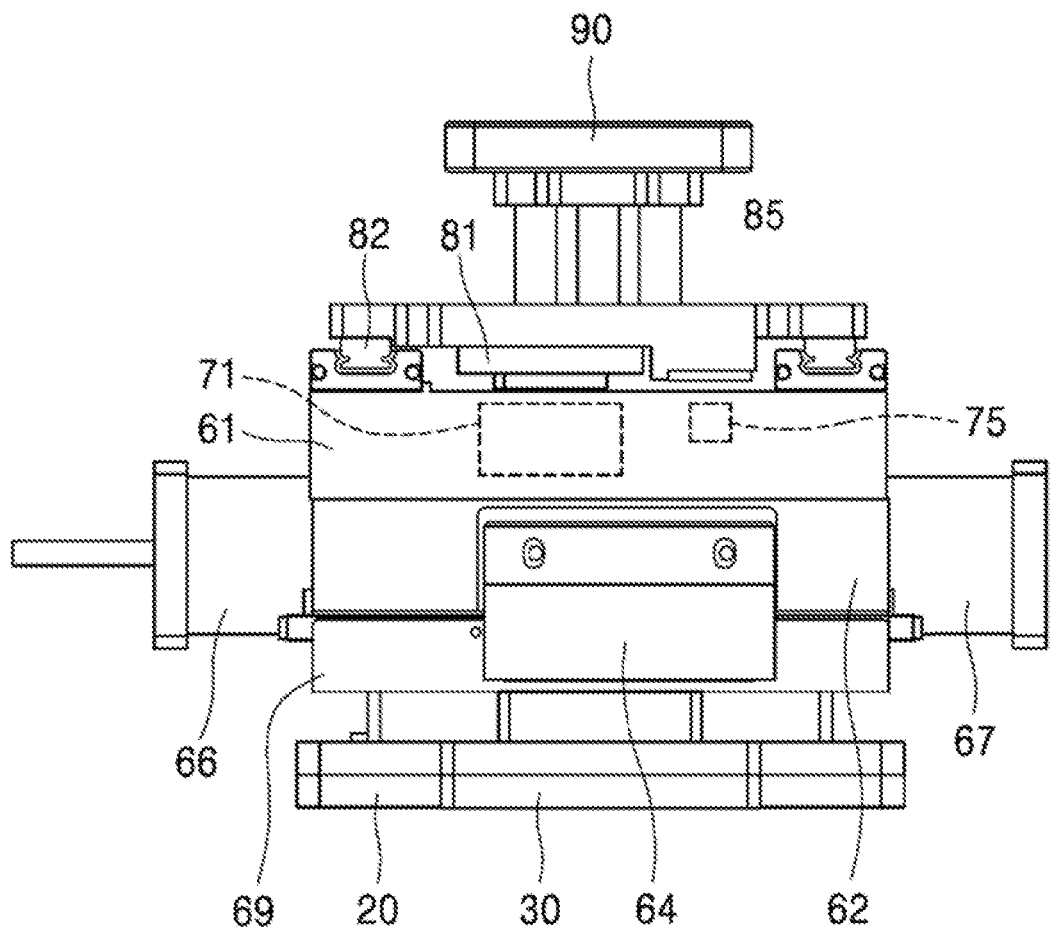
FIGS. 22 to 24 are side views of the transfer equipment when seen in from a second-axis direction, showing the state in which the first-axis slider is slidably moved.
Figure 23:
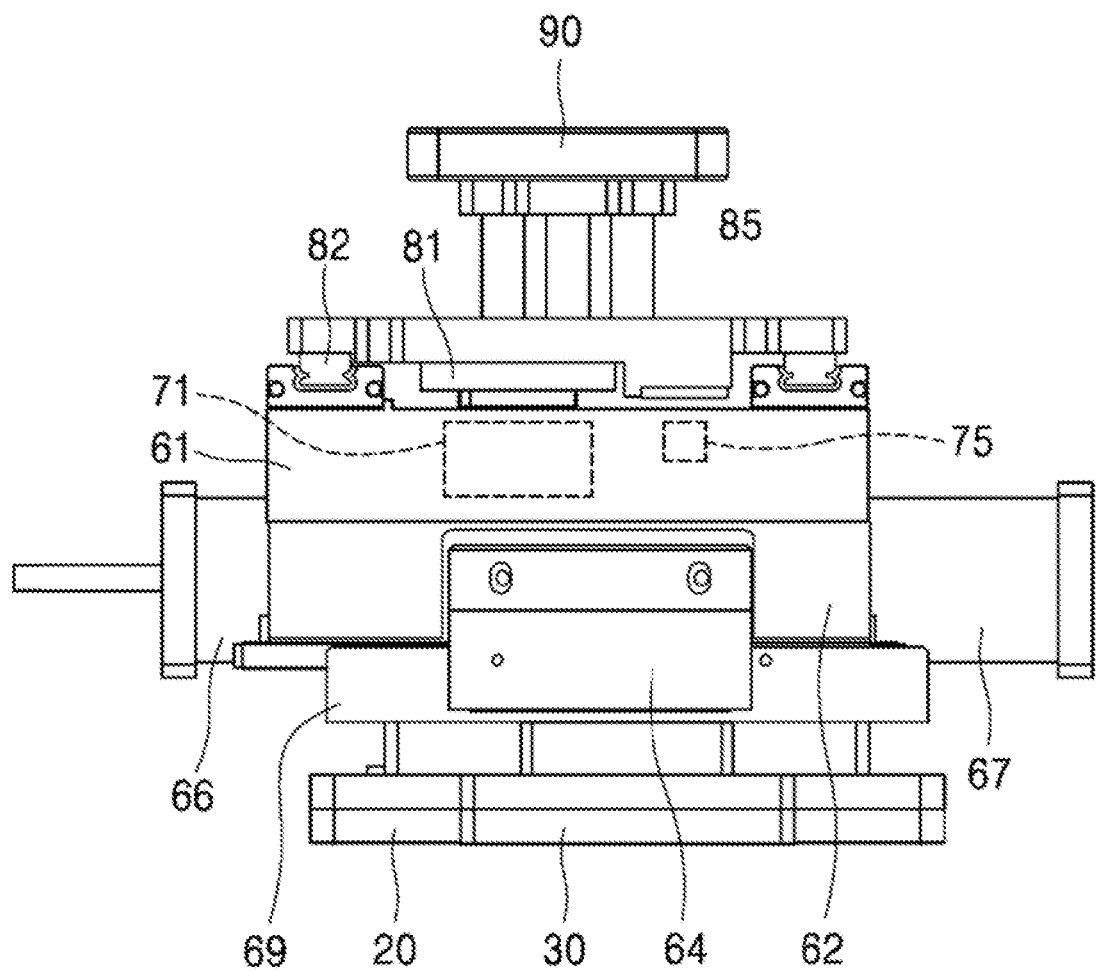
Figure 24:
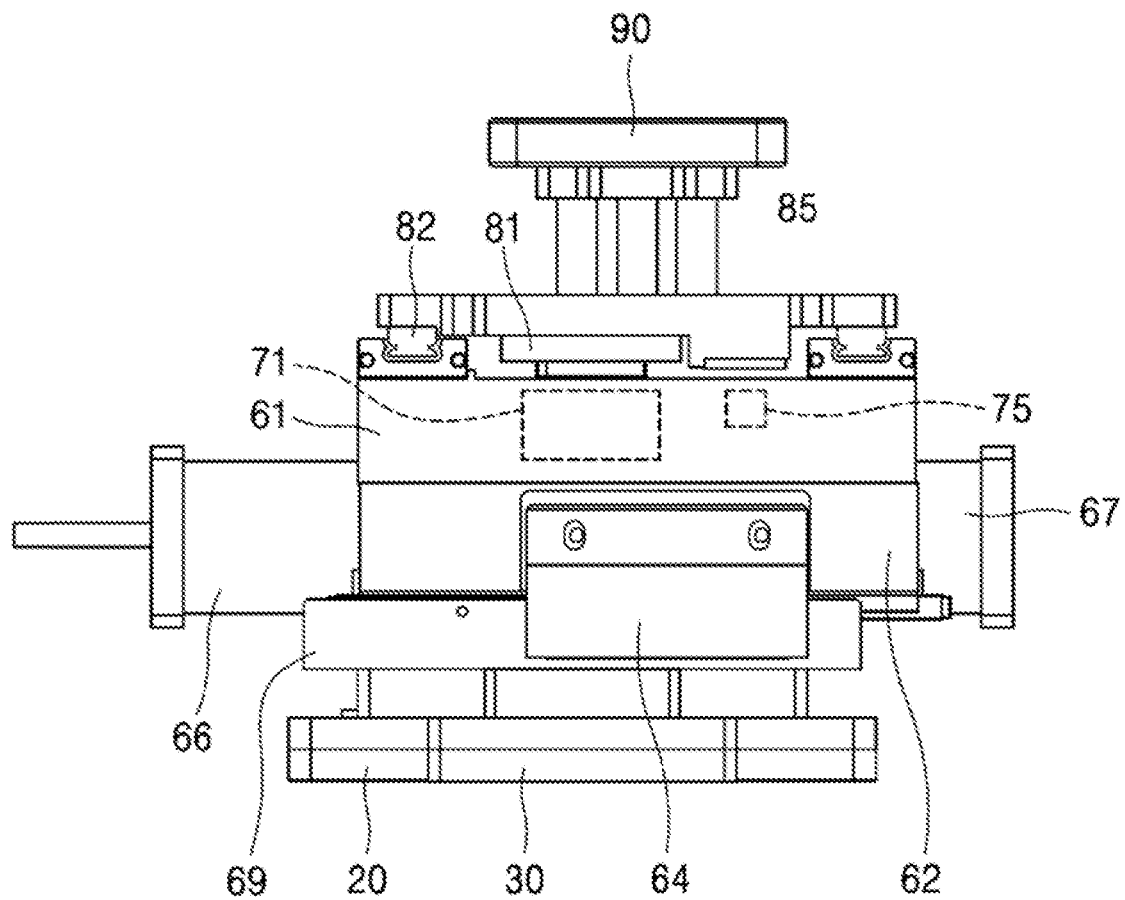
Figure 25:
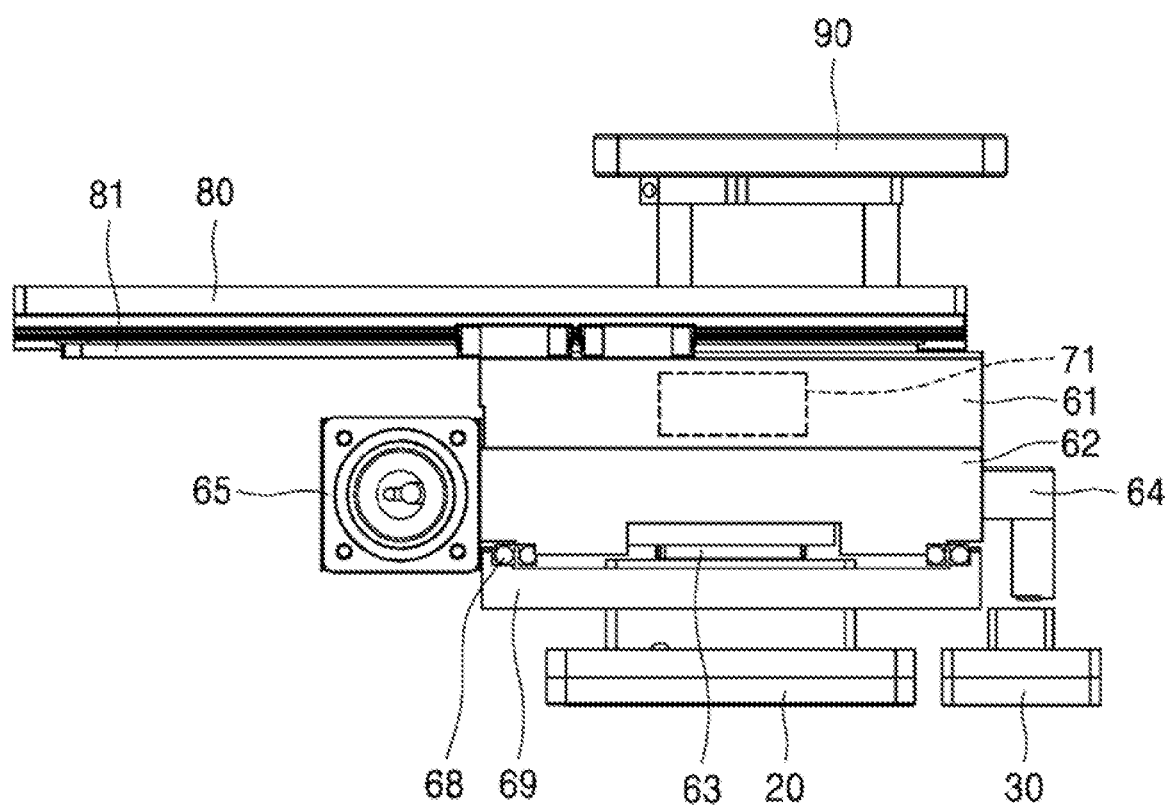
FIG. 25 and FIG. 26 are side views of conveyance equipment seen in a first axis-direction, showing the state in which the second-axis slider is slidably moved
Figure 26:
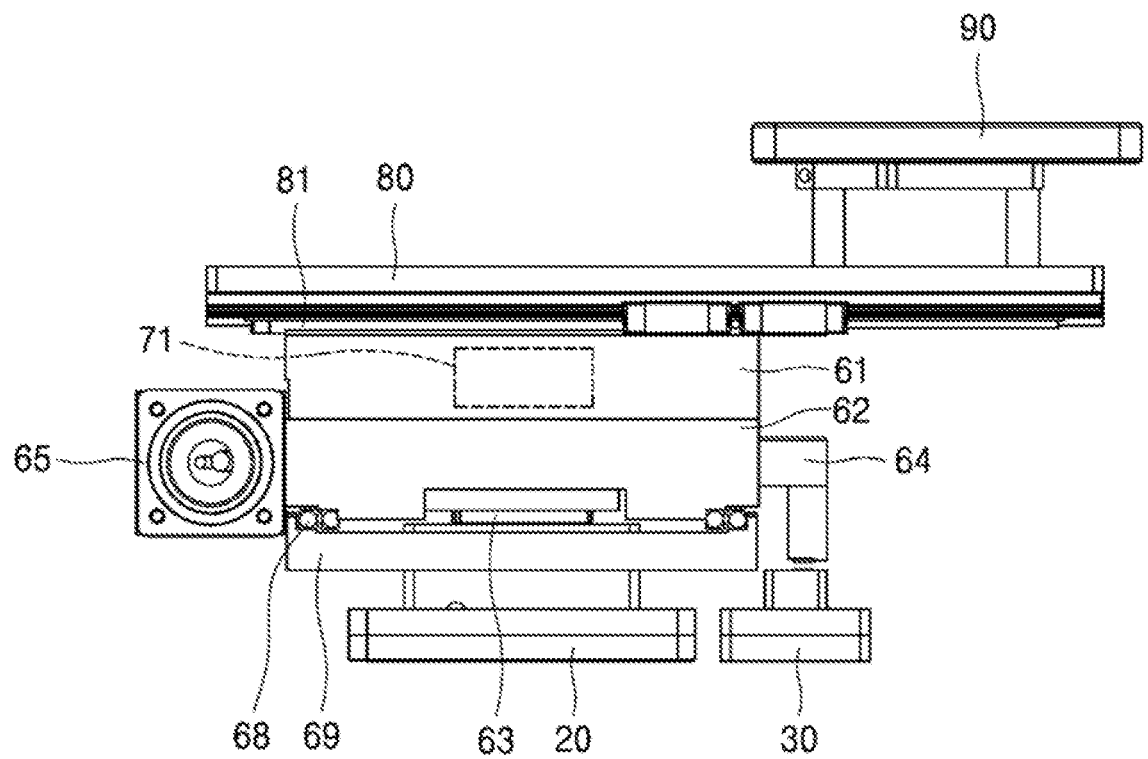

The third cable (711) and the fourth cable (751) connected to the second-axis linear coil (71) and the second-axis encoder (75), respectively, are embedded along a path formed through the second slider (62) as shown in FIGS. 16 and 17.

As shown in the figures, a cable embedding passage formed through the second slider (62) is in an "L"-shape. A first end of the cable embedding passage starts from a side surface of the second slider (62). A second end of the cable embedding passage starts from an upper surface of the second slider (62) corresponding to the coil receiving groove (611) of the first slider (61) and the encoder receiving groove (613). That is, a passage in which cables are embedded is in an "L"-shaped cave in which only both ends are opened.

The bellows holder (65) is provided on a side surface of the second slider (62) where a path for embedding the cables is opened. The bellows holder (65) can also be heretically sealed with a sealing member or something similar thereto and can be installed against a side of the second slider (62).

An inside of the bellows holder (65) is penetrated through in a direction parallel to the first-axis (x-axis) direction and is communicated with the cable embedding passage of the second slider (62). A first bellows (66) and a second bellows (67) are respectively provided at a first end and at a second end to expand in a direction parallel to the first-axis direction. A first end of the two bellows (66 and 67) is hermetically sealed to the bellows holder (65) with a sealing member interposed therebetween. A second end of the two bellows (66, 67) is connected to the bellows connecting portion (19), and sealed with a sealing member or something similar interposed therebetween.

The cables (711, 751), through the cable through hole (191) provided in the bellows connecting portion (19) on a sidewall of the housing (11), the bellows (66, 77), and the cable embedding passage of the second-axis slider (62), are connected to the second-axis linear coil (71) and to the second-axis encoder (75) from an outside of the vacuum chamber.

That is, the bellows (66, 67), the bellows holder (65), the cable embedding passage of the second-axis slider (62), and the coil receiving groove (611) and the encoder receiving groove (613) are separated from an inside of the vacuum chamber, while are opened to an outside of the vacuum chamber. Therefore, the cables (711, 751) connected through such a space are not exposed to a high-voltage environment inside the vacuum chamber, and the second-axis linear coil (71) is also outside a vacuum environment, making cooling process smoother.

On an upper surface of the first slider (61), a second-axis slider (80) is installed to slidingly move in the y-axis direction. A second-axis linear bearing (82) extending in the second-axis direction is provided at a position where the first slider (61) and the second-axis slider (80) face each other.

A second-axis linear permanent magnet (81) extending in the second-axis direction is installed on a lower surface of the second-axis slider (80). The second thin layer (612) provided on an upper portion of the coil receiving groove (611) faces the second-axis linear permanent magnet (81).

While it is better for the second-axis linear permanent magnet (81) and the second-axis linear coil (71) to be as close to each other as possible, the second-axis linear permanent magnet (81) is present inside the vacuum chamber, and the coil receiving groove (611), where the second-axis linear coil (71) is provided, is exposed to an atmospheric pressure environment.

The second thin layer (612) is made with a thickness as thin as possible so that the second-axis linear permanent magnet (81) and the second-axis linear coil (71) can be placed adjacent to each other, while having a thickness sufficient to withstand a difference in pressure between an inside and an outside of the vacuum chamber, and is made of a material (not a ferromagnetic material) that can be penetrated by a magnetic field.

On a bottom surface of the second-axis slider (80), a linear scale (85) is installed extending in the second-axis direction when viewed from the second-axis encoder (75).

According to the structure described above, since the second-axis linear coil (71) and the encoder (75) for the second-axis transfer drive and the transfer control are isolated from an environment inside the vacuum chamber, the cables connected to them are not exposed to a high voltage environment inside the vacuum chamber.

A bed (90) is installed on the second-axis slider (80). A sample plate (91) may be placed on the bed (90).

[Operation of Chamber and Transfer Equipment]

Hereinafter, operation of the vacuum chamber according to the present invention will be described.

Figure 5:
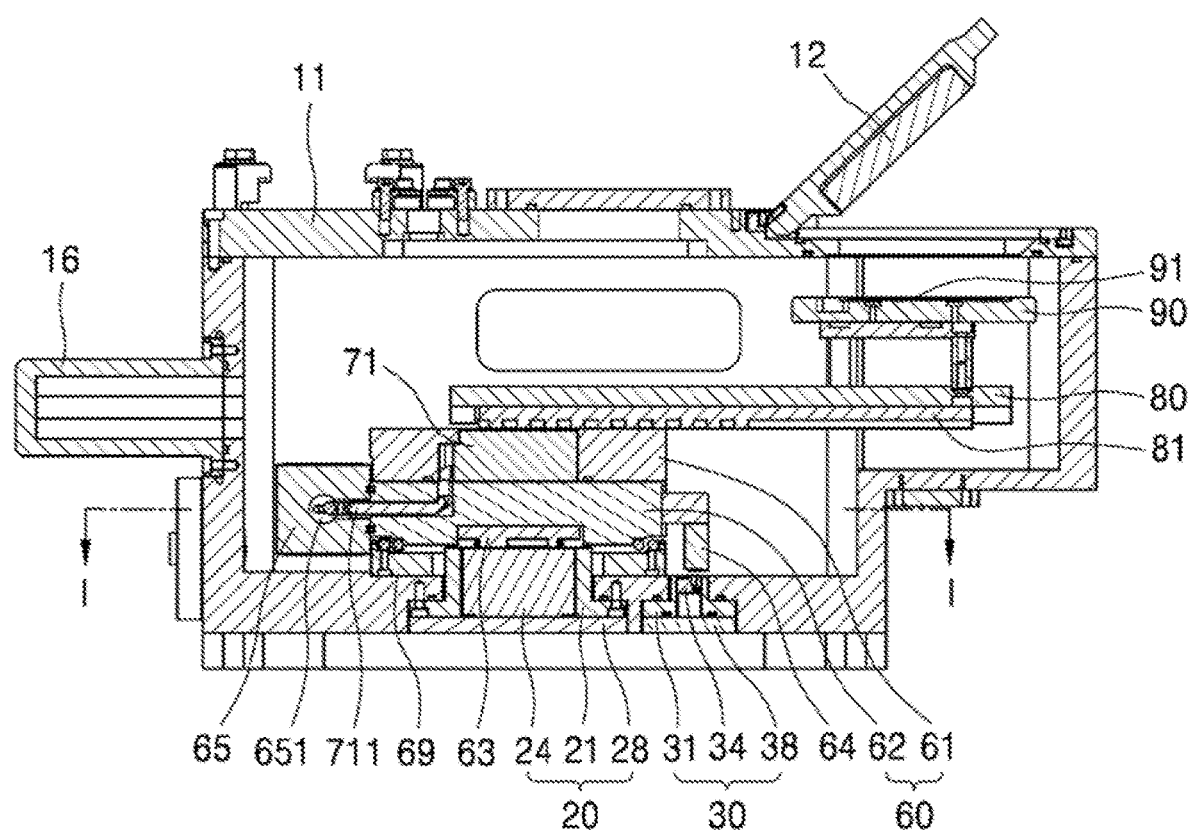
FIG. 5 is a side cross-sectional view of a chamber of the transfer equipment according to the present invention, showing loading and unloading states of a sample.
Figure 6:
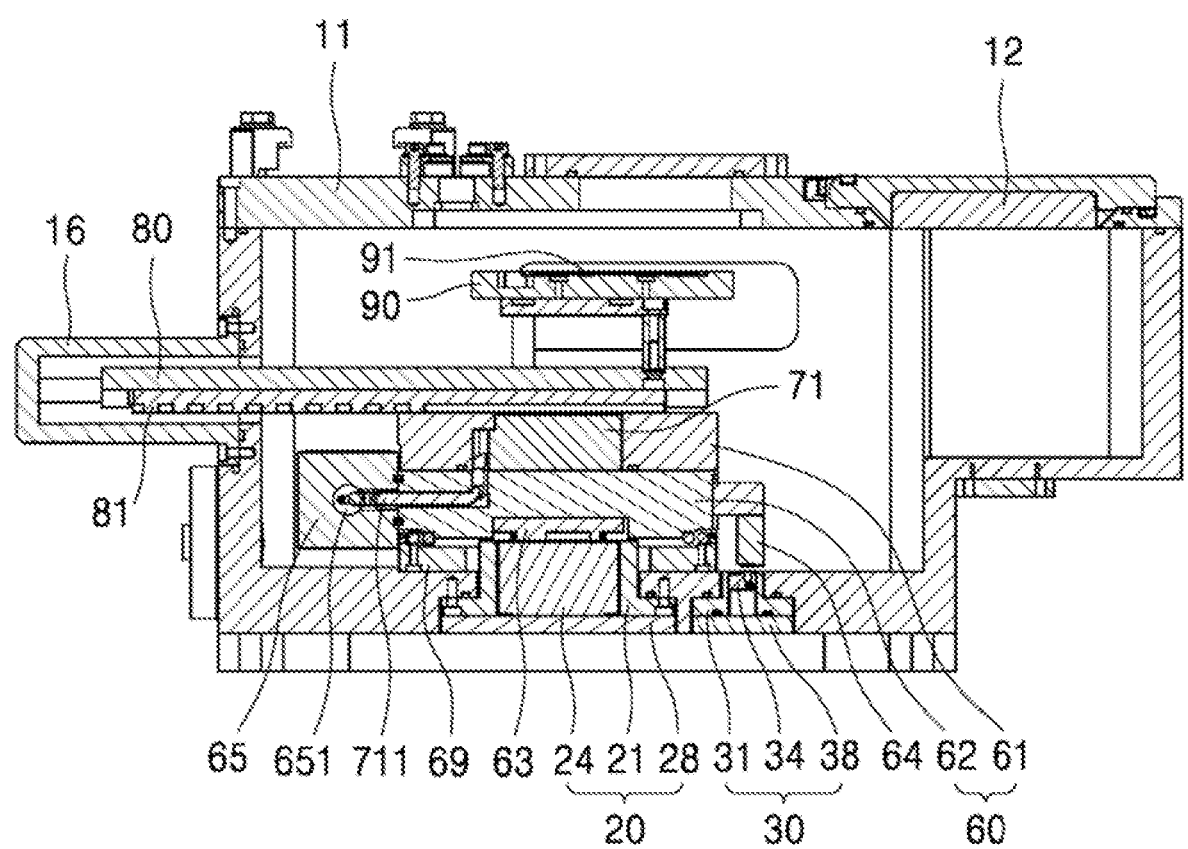
FIG. 6 is a side sectional view showing a state in which the sample is transferred to the test position inside the chamber.
Figure 7:
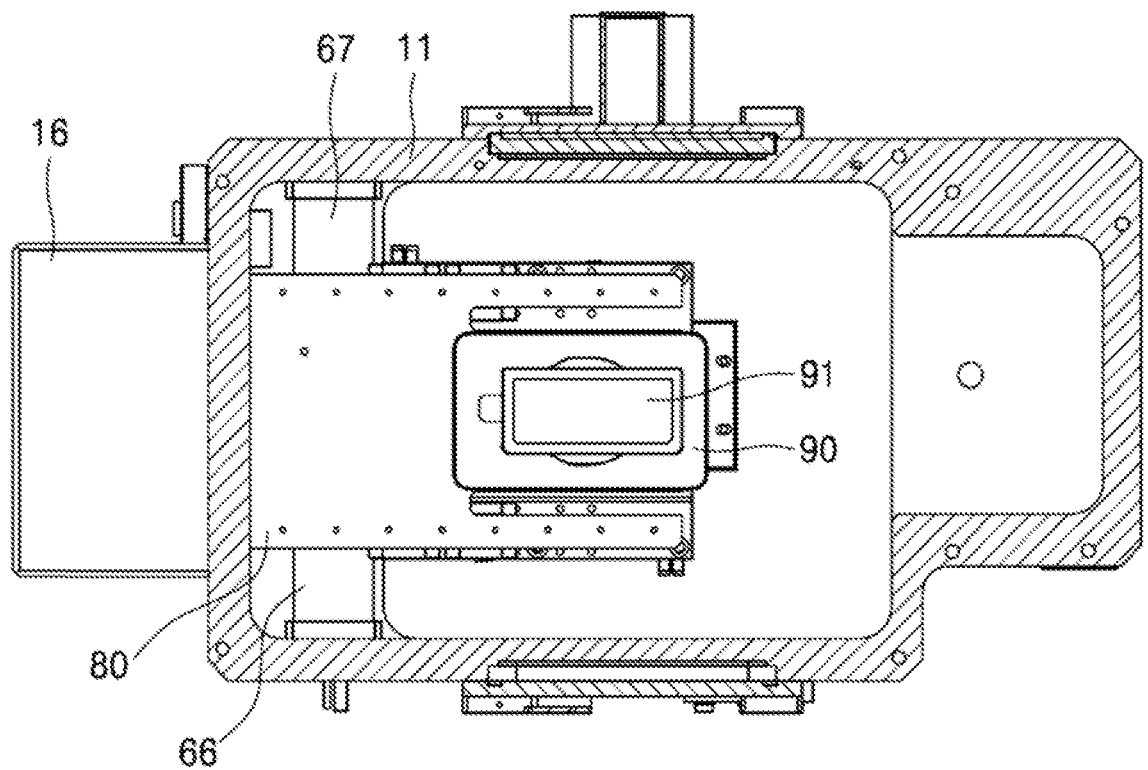
FIG. 7 is a plan view showing an interior of the chamber in the state of FIG. 6 with an upper part of the chamber omitted.
Figure 8:
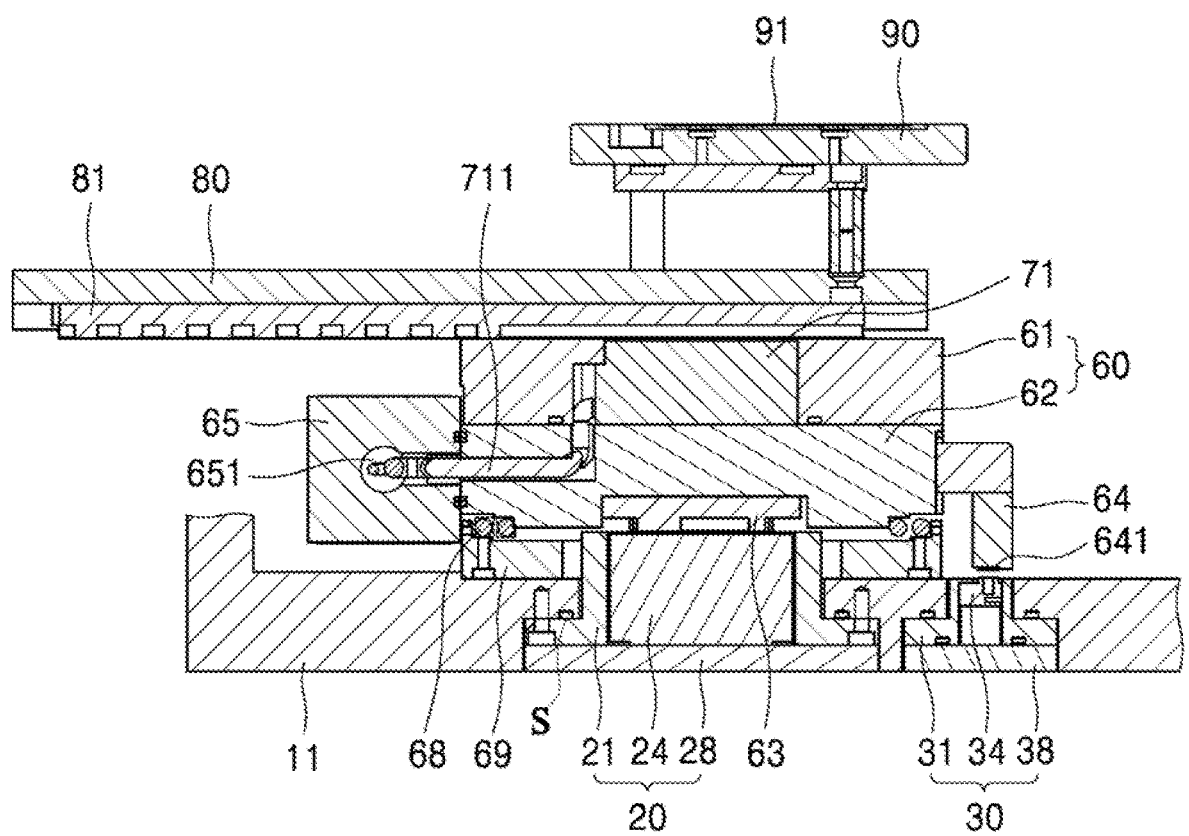
FIG. 8 is a side sectional view enlarging a conveying equipment portion provided in a lower portion of the chamber.
Figure 9:
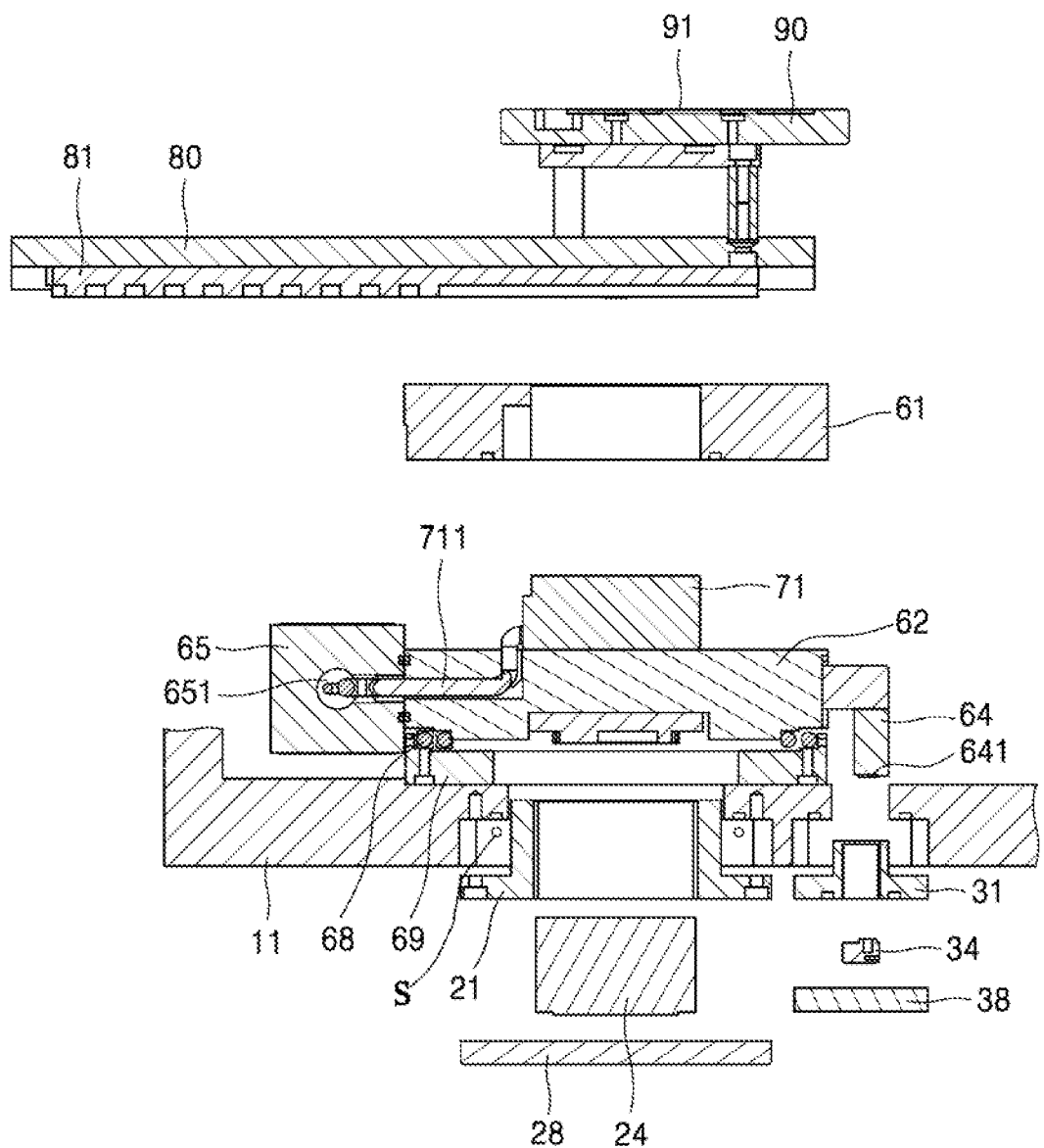
FIG. 9 is an exploded sectional view of FIG. 8.
Figure 10:
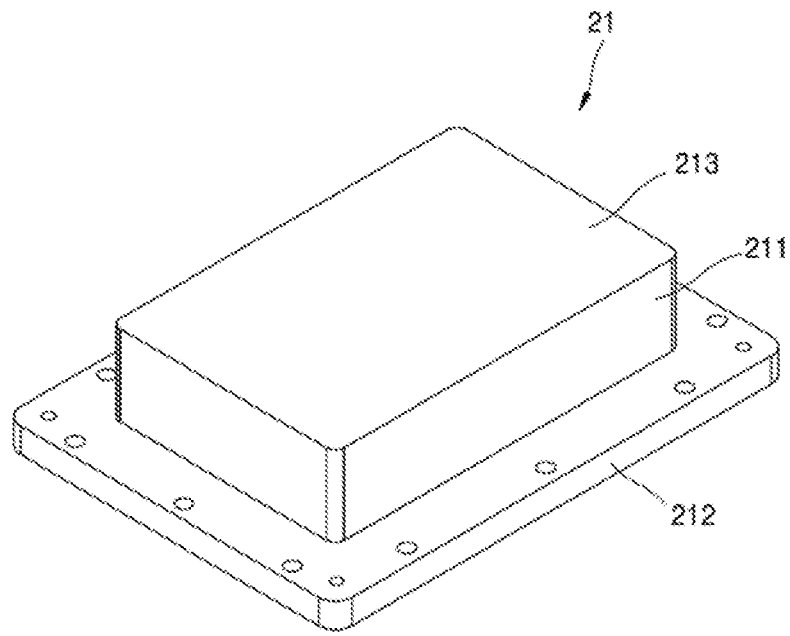
FIG. 10 is a top perspective view of a coil housing of a first-axis coil assembly of the present invention.
Figure 11:
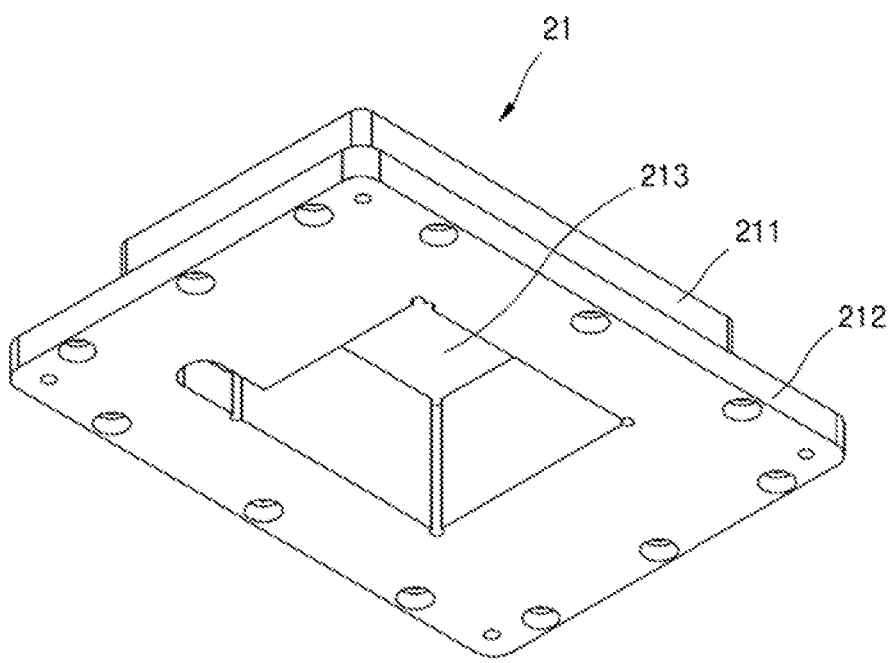
FIG. 11 is a bottom perspective view of the coil housing of FIG. 10.
Figure 12:
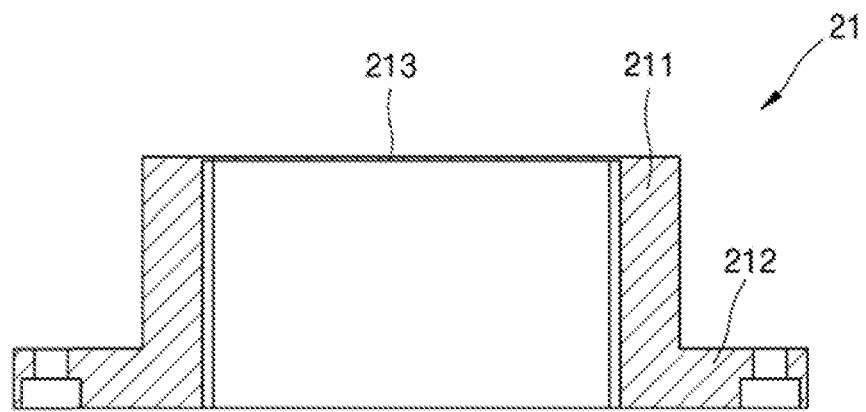
FIG. 12 is a side cross-sectional view of the coil housing of FIG. 10
Figure 13:
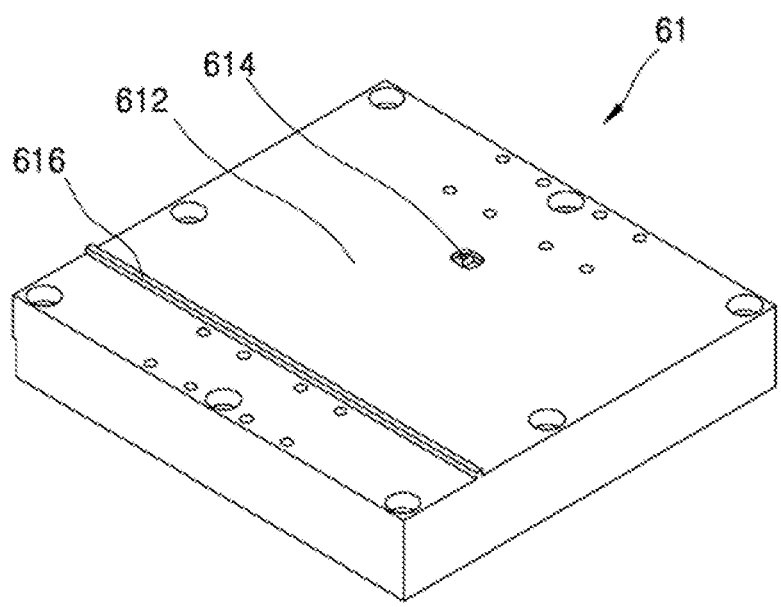
FIG. 13 is an upper perspective view of the first-axis slider.
Figure 14:
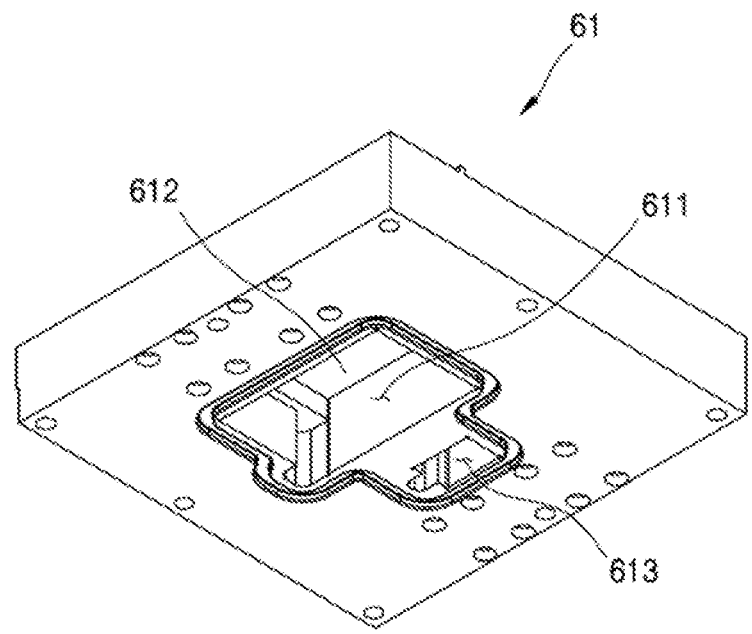
FIG. 14 is a bottom perspective view of the first-axis slider of FIG. 13.
Figure 15:
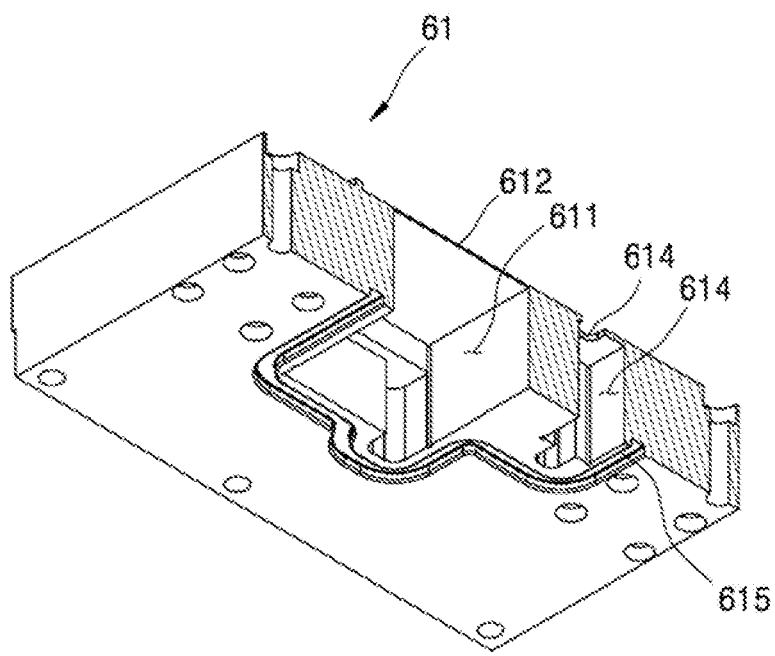
FIG. 15 is a side sectional view of FIG. 14.

An inside of the vacuum chamber (10) is maintained in a vacuum state. As shown in FIG. 5, when the sample is provided in or taken out of the vacuum chamber, the bed (90) is placed below an opening of the door (12). The sample lifting means (13) described above moves the bed (90) closely to the opening. Thus, even when the door (12) is opened, the bed (90) seals the opening of the door (12), preventing a vacuum in the vacuum chamber from leaking.

Under such a state, when the door (12) is opened, a user performs a loading operation for placing the sample (91) on the bed (90). When a loading is completed, the door (12) is closed and the bed (90) is lowered from the opening by the sample lifting means (13), and then the second-axis slider (80) is moved to the second-axis (y-axis) and the bed (90) comes to a test position.

Since the second-axis linear permanent magnet (81) is installed in the second-axis direction on the second-axis slider (80), a distance moved by the second-axis slider in the second-axis direction is at most two times of a distance of the second-axis slider. Accordingly, the present invention minimizes an increase in a size of the housing (11) by providing the extension chamber portion (16) that provides an extended space for accommodating the second-axis slider when the second-axis slider is transferred in the first-axis direction.

Although not shown, since various kinds of equipment necessary for operating the vacuum chamber and testing a sample may be installed in spaces provided at a lower and an tipper portions of the extension chamber portion (16), an overall size of the vacuum chamber (10) hardly increases even when the transfer equipment is designed in such a manner that the linear permanent magnet moves.

Multiple samples are placed on one sample plate (91). Thus, the transfer equipment transfers the bed (90) in the first-axis and the second-axis direction so that different samples can sequentially reach the test position, finely and precisely controlling a position of the bed (90). Specifically, the first-axis linear motors (24, 63) and the first-axis encoders (34, 641) accurately control a position of the bed (90) in the first-axis direction, and the second-axis linear motors (71, 81) and the second-axis encoders (75, 85) precisely control a position of the bed (90) in the second-axis direction.

According to the present invention, the second-axis slider (80) has a long linear motion stroke while the first-axis slider (60) has a short stroke. Therefore, there is almost no increase in a volume of the vacuum chamber due to a stroke of a linear motion, of the first-axis slider.

Moreover, because the first-axis linear coil (24) and the encoder (34) for moving the first-axis slider (60) are located outside the vacuum chamber (10), cables connected to the linear coil (24) and the encoder (34) are not present in the vacuum chamber, thus eliminating a need to use expensive cables or feedthroughs and a problem of disturbance under a high voltage environment. Further, the first-axis linear coil (24) is easier to dissipate heat into an atmosphere.

In addition, the second-axis linear coil (71) and the second-axis encoder (75) for moving the second-axis slider (80) are also present in inner spaces (611, 613) of the first-axis slider (60) that are communicated with an outside, and the cables (711, 751) are also placed in an external environment of the vacuum chamber, thus eliminating a need to use expensive cables or feedthroughs and a problem of disturbance under a high voltage environment. Further, since the second-axis linear coil (71) is in an atmosphere, it is easy to dissipate heat.

While the present invention has been particularly shown and described with reference to exemplary embodiments thereof, it is to be understood that a scope of the present invention is not limited to the disclosed exemplary embodiments. It is obvious that different modifications can be made by a person having an ordinary skill in the art. Although advantages of the present invention are not specifically described in the above embodiments, the effects can be predicted by a person having an ordinary skill in the art from the configurations shown above.

DESCRIPTION OF REFERENCE NUMERALS

10: Vacuum chamber
11: Housing
12: Door
13: Sample lifting means
14: Transparent window
15: Vacuum pump
16: Extension chamber portion
17: Coil mounting portion
171: First step part
172: First sealing groove
18: Encoder mounting portion
181: Second step part
182: Second sealing groove
19: Bellows connecting portion
191: Cable through hole
20: First-axis (x-axis) coil assembly
21: Coil housing
211: Sidewall portion
212: Flange portion
213: First thin layer
24: First-axis (x-axis) linear coil
28: Coil cover
30: First-axis (x-axis) encoder assembly
31: Encoder Housing
34: Encoder
38: Encoder cover
60: First-axis (x-axis) slider
61: First slider
611: Coil receiving groove
612: Second thin layer
613: Encoder receiving groove
614: Encoder hole
615: Sealing groove
616: Guide rail
62: Second slider
63: First-axis (x-axis) linear permanent magnet
64: Encoder reader part
641: scale (linear scale)
65: Bellows holder
651: Through hole
66: First bellows
67: Second bellows
68: First-axis (x-axis) linear bearing
69: Base plate
71: Second-axis (y-axis) linear coil
711: Third cable
75: Second-axis (y-axis) encoder
751: Fourth cable
80: Second-axis (y-axis) slider
81: Second-axis (y-axis) linear permanent magnet 82: Second-axis (y-axis) Linear bearing
85: encoder scale (linear scale)
90: Bed
91: Sample plate
[Representative Figure]
FIG. 5

What is claimed is:

1. A transfer equipment, installed in a vacuum chamber (10) having a housing (11), for transferring a bed (90) inside the vacuum chamber (10) in a first-axis direction and in a second-axis direction different from the first-axis direction, the transfer equipment comprising:
a first-axis linear coil (24) provided outside the housing (11) of the vacuum chamber (10);
a first-axis slider (60) installed inside the vacuum chamber (10) and slidingly movable in the first-axis direction;
a first-axis linear permanent magnet (63) arranged in the first-axis direction, installed to the first-axis slider (60), facing the first-axis linear coil (24), and slidingly movable in the first-axis direction along with the first-axis slider (60);
a first thin layer (213) placed between the first-axis linear coil (24) and the first-axis permanent magnet (63), having a thickness thinner than a thickness of the housing (11), including a material through which the magnetic field penetrates, and having a first side that faces inside the vacuum chamber and a second side that faces outside the vacuum chamber; and
a first cable provided outside the vacuum chamber (10) and connected to the first-axis linear coil (24),
wherein the first-axis linear coil (24) is housed in a coil housing (21), wherein the coil housing (21) is installed in the housing (11) of the vacuum chamber (10),
wherein the first thin layer (213) is provided at the coil housing (21).

2. The transfer equipment of claim 1, wherein the coil housing (21) comprises:
a sidewall portion (211) surrounding a side of the first-axis linear coil (24),
wherein the thin layer (213) is provided on the side wall portion (211),
wherein the thin layer (213) and the side wall portion (211) surround the first-axis linear coil (24).

3. The transfer equipment of claim 2,
wherein the coil housing (21) further comprises a flange portion (212) laterally extending outward from the side wall portion (211).

4. The transfer equipment of claim 3,
wherein a sealing member (S) is inserted between the flange portion (212) and the housing (11) of the vacuum chamber (10).

5. The transfer equipment of claim 2,
wherein a coil cover (28) is provided under the sidewall portion (211) of the coil housing (21) and covers a lower portion of the first-axis linear coil (24).

6. A transfer equipment, installed in a vacuum chamber (10) having a housing (11), for transferring a bed (90) inside the vacuum chamber (10) in a first-axis direction and in a second-axis direction different from the first-axis direction, the transfer equipment comprising:
a first-axis linear coil (24) provided outside the housing (11) of the vacuum chamber (10);
a first-axis slider (60) installed inside the vacuum chamber (10) and slidingly movable in the first-axis direction;
a first-axis linear permanent magnet (63) arranged in the first-axis direction, installed to the first-axis slider (60), facing the first-axis linear coil (24), and slidingly movable in the first-axis direction along with the first-axis slider (60); and
a first cable provided outside the vacuum chamber (10) and connected to the first-axis linear coil (24),
wherein the first-axis slider (60) includes a first linear scale (641) extending in the first-axis direction,
wherein an encoder (34) faces the first linear scale (641), installed outside the vacuum chamber, and is provided on a bottom of the housing (11) of the vacuum chamber (10),
wherein a second cable is connected to the encoder (34) from outside the vacuum chamber (10).

7. A transfer equipment, installed in a vacuum chamber (10) having a housing (11), for transferring a bed (90) inside the vacuum chamber (10) in a first-axis direction and in a second-axis direction different from the first-axis direction, the transfer equipment comprising:
a first-axis linear coil (24) provided outside the housing (11) of the vacuum chamber (10);
a first-axis slider (60) installed inside the vacuum chamber (10) and slidingly movable in the first-axis direction;
a first-axis linear permanent magnet (63) arranged in the first-axis direction, installed to the first-axis slider (60), facing the first-axis linear coil (24), and slidingly movable in the first-axis direction along with the first-axis slider (60); and
a first cable provided outside the vacuum chamber (10) and connected to the first-axis linear coil (24),
wherein a coil receiving groove (611) is provided inside the first-axis slider (60) and is isolated from an inner space of the vacuum chamber,
wherein a second-axis linear coil (71) is provided in the coil receiving groove (611),
wherein a second-axis slider (80) is provided in the vacuum chamber (10), installed at the first-axis slider (60), and slidingly moves in the second-axis direction,
wherein a second-axis linear permanent magnet (81) is installed between the second-axis slider (80) and the second-axis linear coil (71), is arranged in the second-axis direction, and slidingly moves together with the second-axis slider (80).

8. The transfer equipment of claim 7,
wherein the first-axis slider (60) includes a second thin layer (612),
wherein the second thin layer (612) is provided between the second-axis linear coil (71) and the second-axis linear permanent magnet (81),
wherein the second thin layer (612) has a thickness thinner than a thickness of a portion of the first-axis slider (60) surrounding the second thin layer (612), includes a material through which magnetic field penetrates, and has a first side and a second side,
wherein the first side of the first-axis slider (60), which faces the second-axis linear permanent magnet (81), faces inside the vacuum chamber,
wherein the second side, which faces the second-axis linear coil (71), is isolated from a vacuum environment of the vacuum chamber.

9. The transfer equipment of claim 7,
wherein the housing (11) of the vacuum chamber (10) includes a first bellows connecting portion (19),
wherein the first bellows connecting portion (19) includes a cable through hole (191), wherein a first bellows (66) is provided inside the vacuum chamber (10),
wherein a first end of the first bellows (66) is connected to the first bellows connecting portion (19) and a second end of the first bellows (66) is connected to the first-axis slider (60) to provide a passage that connects the coil receiving groove (611) to outside the vacuum chamber (10),
wherein a third cable (711) is connected to the second-axis linear coil (71) through the cable through hole (191) and the first bellows (66).

10. The transfer equipment of claim 7,
wherein the second-axis slider (80) includes a second linear scale (85) extending in the second-axis direction,
wherein the first-axis slider (60) includes an encoder receiving groove (613),
wherein the encoder receiving groove (613) is isolated from an inner space of the vacuum chamber,
wherein the encoder receiving groove (613) contains a second-axis encoder (75) facing the second linear scale (85).

11. The transfer equipment of claim 10,
wherein the housing (11) of the vacuum chamber (10) includes a first bellows connecting portion (19),
wherein the first bellows connecting portion (19) includes a cable through hole (191),
wherein a first bellows (66) is provided inside the vacuum chamber (10),
wherein a first end of the first bellows (66) is connected to the first bellows connecting portion (19) and a second end of the first bellows (66) is connected to the first-axis slider (60) to provide a passage that connects the encoder receiving groove (613) to outside the vacuum chamber (10),
wherein a fourth cable (751) is connected to the second-axis encoder (75) through the cable through hole (191) and the bellows (66).

12. The transfer equipment of claim 7,
wherein the housing (11) of the vacuum chamber (10) includes first and second bellows connecting portions (19),
wherein each of the first and second bellows connecting portions (19) includes a cable through hole (191),
wherein first and second bellows (66, 67) are provided inside the vacuum chamber (10),
wherein first ends of the first and the second bellows (66, 67) are connected to the first and the second bellows connecting portions (19), respectively,
wherein second ends of the first and the second bellows (66, 67) are connected to the first-axis slider (60) to provide a passage that connects the coil receiving groove (611) to outside the vacuum chamber (10),
wherein the first-axis slider (60) includes a bellows holder (65) connected to the second ends of the first and the second bellows (66, 67),
wherein the first and the second bellows (66, 67) extend parallel to the first-axis direction,
wherein the first and the second bellows (66, 67) extend in opposite directions to each other with respect to the bellows holder (65).

13. The transfer equipment of claim 7, wherein the bed (90) is provided on the second-axis slider (80).

14. The transfer equipment of claim 7, wherein the first-axis slider (60) includes a first slider (61) and a second slider (62) located below the first slider.

15. The transfer equipment of claim 14, wherein the first-axis linear permanent magnet (63) is installed on a lower surface of the second slider (62).

16. The transfer equipment of claim 14,
wherein the first slider (61) is provided with the coil receiving groove (611),
wherein the coil receiving groove (611) is concave upward from a bottom of the first slider (61).

17. The transfer equipment of claim 16, wherein an upper end of the coil receiving groove (611) is closed by a second thin layer (612).

18. The transfer equipment of claim 16, wherein a sealing member which is provided around the coil receiving groove (611) is interposed and pressed between the first slider (61) and the second slider (62).

19. The transfer equipment of claim 16, wherein a cable embedding passage is formed through the second slider (62).

20. The transfer equipment of claim 6, further comprising:
an encoder housing (31) in which the encoder (34) is placed,
wherein the encoder housing (31) is provided with a flange extending laterally outward from the encoder housing (31), and the flange is closely attached to the housing (11) via a sealing member.

* * * * *